(12) United States Patent
Yamashita et al.

(10) Patent No.: US 8,883,617 B2
(45) Date of Patent: Nov. 11, 2014

(54) METHOD FOR MANUFACTURING A METAL OXIDE SEMICONDUCTOR

(75) Inventors: Yoshihisa Yamashita, Kyoto (JP); Kulbinder Kumar Banger, Cambridgeshire (GB); Henning Sirringhaus, Cambridgeshire (GB)

(73) Assignees: Panasonic Corporation, Osaka (JP); Cambridge Enterprise Ltd., Cambridgeshire (GB)

( * ) Notice: Subject to any disclaimer, the term of this patent is extended or adjusted under 35 U.S.C. 154(b) by 189 days.

(21) Appl. No.: 13/609,959

(22) Filed: Sep. 11, 2012

(65) Prior Publication Data

US 2013/0005124 A1  Jan. 3, 2013

Related U.S. Application Data

(63) Continuation of application No. PCT/GB2010/001730, filed on Sep. 13, 2010.

(51) Int. Cl.
| | |
|---|---|
| *H01L 21/368* | (2006.01) |
| *C23C 18/12* | (2006.01) |
| *H01L 29/786* | (2006.01) |
| *H01L 29/66* | (2006.01) |
| *H01L 21/02* | (2006.01) |

(52) U.S. Cl.
CPC ........ *H01L 29/7869* (2013.01); *C23C 18/1283* (2013.01); *H01L 29/66742* (2013.01); *H01L 21/02554* (2013.01); *C23C 18/1216* (2013.01); *H01L 21/02628* (2013.01); *H01L 21/02565* (2013.01)
USPC ...................... 438/502; 438/93; 257/E21.464

(58) Field of Classification Search
CPC ..................... C23C 18/1283; H01L 21/02554; H01L 21/02628
USPC ................................................... 438/502, 93
See application file for complete search history.

(56) References Cited

U.S. PATENT DOCUMENTS

| | | |
|---|---|---|
| 6,455,106 B1 | 9/2002 | Qiu et al. |
| 2003/0122122 A1 | 7/2003 | Iwata |
| 2005/0130844 A1 | 6/2005 | Iwata |
| 2006/0108636 A1 | 5/2006 | Sano et al. |
| 2007/0166872 A1 | 7/2007 | Prene et al. |

(Continued)

FOREIGN PATENT DOCUMENTS

| | | |
|---|---|---|
| JP | 5-43241 | 2/1993 |
| JP | 10-87304 | 4/1998 |

(Continued)

OTHER PUBLICATIONS

Koo et al., "Low Temperature Solution-Processed InZnO Thin-Film Transistors", Journal of the Electrochemical Society, vol. 157, No. 4, Feb. 25, 2010, pp. J111-J115.

(Continued)

*Primary Examiner* — Alexander Ghyka
(74) *Attorney, Agent, or Firm* — Greenblum & Bernstein, P.L.C.

(57) ABSTRACT

One aspect in the present disclosure relates to a method for manufacturing an amorphous metal oxide semiconductor. In an exemplary embodiment, a film is deposited on a substrate from a mixed solution as a starting element. For example, the mixed solution includes at least an indium alkoxide and a zinc alkoxide in a solvent. The film made from the mixed solution on the substrate is cured by thermal-annealing in a water vapor atmosphere, at a temperature range of, for example, 210 to 275 degrees Celsius, inclusive.

12 Claims, 48 Drawing Sheets

(56) References Cited

U.S. PATENT DOCUMENTS

| | | |
|---|---|---|
| 2009/0104474 A1 | 4/2009 | Schwartz et al. |
| 2009/0179199 A1 | 7/2009 | Sano et al. |
| 2010/0210069 A1 | 8/2010 | Seon et al. |
| 2011/0101344 A1 | 5/2011 | Mori et al. |
| 2012/0037901 A1 | 2/2012 | Mori et al. |

FOREIGN PATENT DOCUMENTS

| | | |
|---|---|---|
| JP | 2003-179242 | 6/2003 |
| JP | 2005-223231 | 8/2005 |
| JP | 2006-165529 | 6/2006 |
| JP | 2007-141892 | 6/2007 |
| JP | 3944917 | 7/2007 |
| JP | 2010-021333 | 1/2010 |
| JP | 2010-258057 | 11/2010 |
| KR | 2010-95328 | 8/2010 |

OTHER PUBLICATIONS

International Search Report issued with respect to PCT/GB2010/001730, mailed Jun. 14, 2011.

Korean Office action in counterpart application No. KR10-2012-7026567, dated Oct. 28, 2013.

Japanese Office action in counterpart application No. JP2012-555476, dated Dec. 3, 2013.

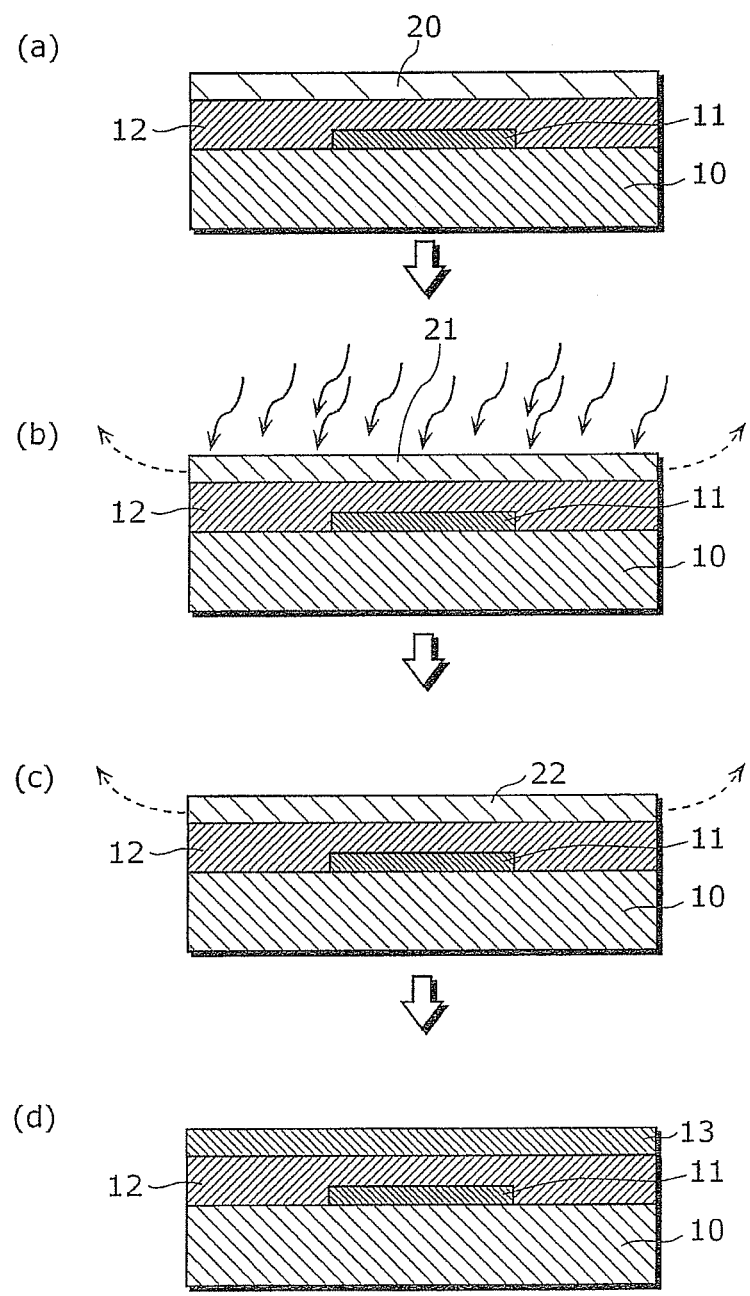

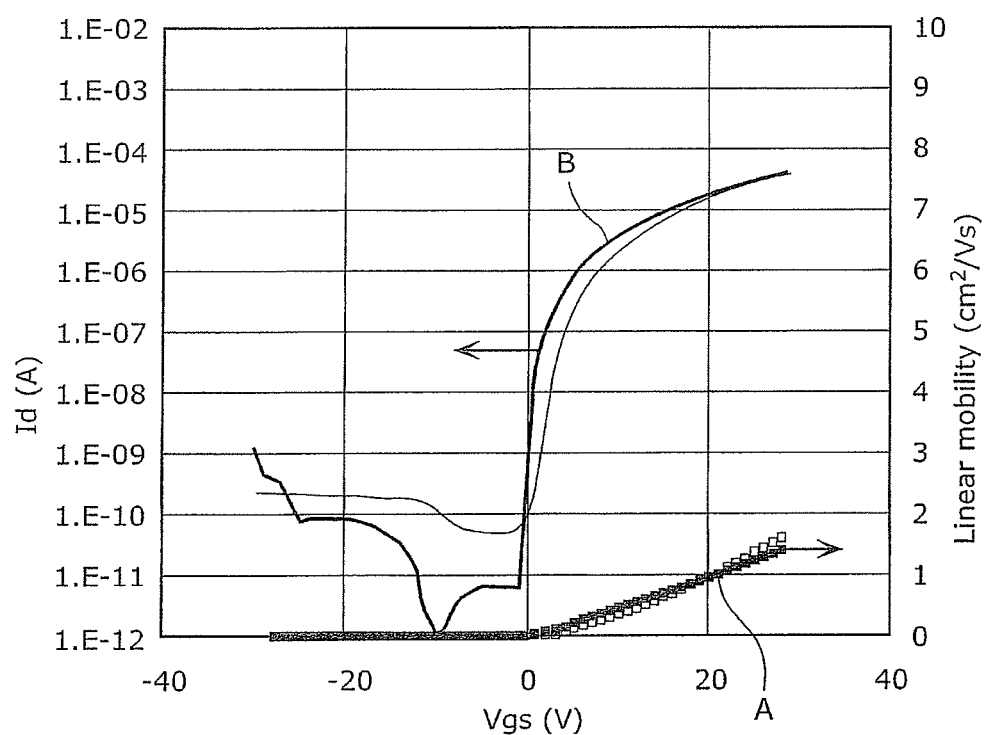

450°C

Wet 230°C → Dry 210°C

Wet 230°C → Dry 245°C

Wet 230°C → Dry 260°C

Wet 230°C → Dry 190°C

Wet 230°C → Dry 0min

Wet 230℃ → Dry 5min

Wet 230°C → Dry 15min

Wet 230°C → Dry 30min

Wet 230°C → Dry 60min

Wet 230°C

Wet 220°C

Wet 210°C

METHOD FOR MANUFACTURING A METAL OXIDE SEMICONDUCTOR

CROSS REFERENCE TO RELATED APPLICATION

This is a continuation application of PCT Patent Application No. PCT/GB2010/001730 filed on Sep. 13, 2010, designating the United States of America. The entire disclosure of the above-identified application, including the specifications, drawings and claims are incorporated herein by reference in its entirety.

FIELD

One or more exemplary embodiments disclosed herein relate generally to a metal oxide semiconductor and relate particularly to a method for manufacturing a metal oxide semiconductor.

BACKGROUND

Conventional Thin Film Transistors (TFTs) predominantly use, in the semiconductor layer, silicon such as an amorphous silicon thin film and a polycrystalline silicon thin film which is formed through polycrystallization of an amorphous silicon thin film using an excimer laser and so on.

In recent years, much focus has been placed on amorphous metal oxide semiconductors as a semiconductor layer for next-generation TFTs. In terms of transparency, such semiconductors show promise for application to displays, electronic paper, and so on. Even in terms of mobility, such semiconductors are also materials which can realize the 3 to 20 $cm^2/Vs$ required by high-performance liquid crystal and organic Electro-Luminescence (EL).

An amorphous indium zinc oxide semiconductor (a-InZnO) including indium (In) and zinc (Zn), an amorphous indium Gallium zinc oxide semiconductor (a-InGaZnO) which further includes gallium (Ga) as one more type of metal component, and so on, are known as representatives of amorphous metal oxide semiconductors.

Meanwhile, the sputtering method, which forms a film from vapor, and the sol-gel method, which forms a film from a solution, are representative methods for manufacturing a semiconductor layer (See PTL 1, PTL 2, and PTL 3, for example). The latter is characterized in being applicable to substrates with large surface areas and substrates with complex shapes.

The sol-gel method is a method in which a solution is prepared that includes, for each component metal of a metal oxide, a precursor which is a hydrolyzable organic compound, the solution undergoes hydrolysis reaction and polycondensation reaction to form a gel that has lost fluidity, and the gel is thermal-annealed to obtain a solid metal oxide. Metal alkoxides, and the like, are given as precursors. Water for the hydrolysis reaction and catalysts such as an acid, base, and so on, for controlling the hydrolysis reaction and the polycondensation reaction are further added to the precursor solution.

CITATION LIST

Patent Literature

[PTL 1] Japanese Unexamined Patent Application Publication No. 2006-165529
[PTL 2] Japanese Unexamined Patent Application Publication No. 2003-179242
[PTL 3] Japanese Unexamined Patent Application Publication No. 2005-223231

SUMMARY

Technical Problem

However, it is difficult to form a thin film of a metal oxide semiconductor at low temperature when a precursor solution is deposited on a substrate and the precursor solution is thermal-annealed in air, to form a thin film of an amorphous metal oxide semiconductor using the sol-gel method.

Consequently, in view of the above-described problems, one non-limiting and exemplary embodiment provides a method for forming a thin film of a metal oxide semiconductor in low temperature.

Solution to Problem

In one general aspect, the techniques disclosed here feature a method for manufacturing a metal oxide semiconductor comprising: depositing a film on a substrate from a mixed solution of at least two precursors in a solvent, wherein at least one of the precursors is a metal alkoxide; and curing the film deposited on the substrate, in a presence of an aqueous catalyst, inclusive, to form, from the mixed solution, a metal oxide semiconductor.

These general and specific aspects may be implemented using a system, a method, an integrated circuit, a computer program, or a computer-readable recording medium such as a CD-ROM, or any combination of systems, methods, integrated circuits, computer programs, or computer-readable recording media.

Additional benefits and advantages of the disclosed embodiment will be apparent from the Specification and Drawings. The benefits and/or advantages may be individually obtained by the various embodiments and features of the Specification and Drawings, which need not all be provided in order to obtain one or more of such benefits and/or advantages.

Advantageous Effects

According to a metal oxide semiconductor manufacturing method according to one or more exemplary embodiments or features disclosed herein, a thin film of a metal oxide can be formed in low temperature.

BRIEF DESCRIPTION OF DRAWINGS

These and other advantages and features will become apparent from the following description thereof taken in conjunction with the accompanying Drawings, by way of non-limiting examples of embodiments disclosed herein.

FIG. 2 is a cross-sectional view showing details of a process of forming an amorphous metal oxide semiconductor layer (process shown in (d) in FIG. 1) in the method for manufacturing a thin film transistor device according to the embodiment.

FIG. 4D is a graph showing the gate voltage dependency of the mobility and drain current of a thin film transistor device as a comparative example.

Figure 1:
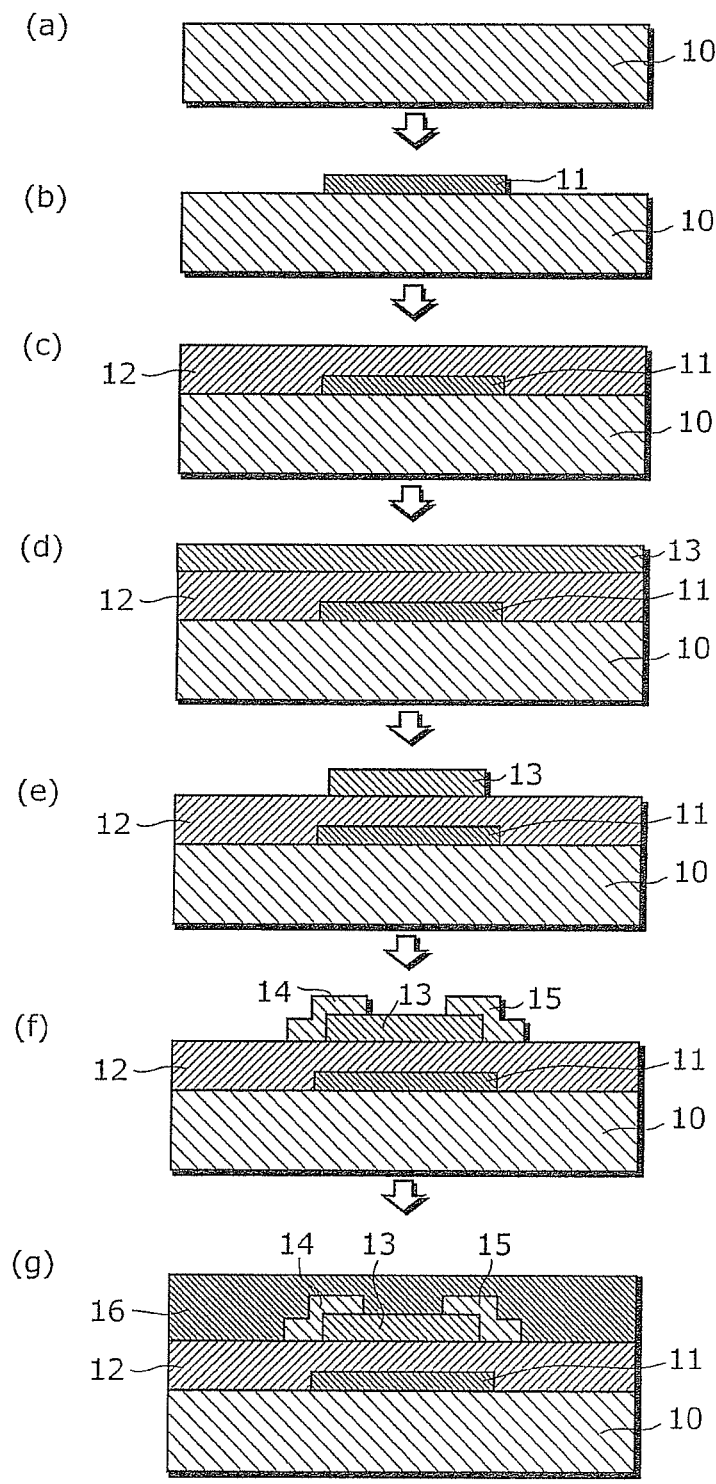
FIG. 1 is a cross-sectional view for schematically describing a method for manufacturing a thin film transistor device according to one exemplary embodiment.

DESCRIPTION OF EMBODIMENT (Underlying Knowledge Forming Basis of the Present Disclosure)

In relation to the forming the thin film of the amorphous metal oxide semiconductor using the sol-gel method, the inventors have found the following problems:

First, when water is added to the precursor solution in a storage container prior to the deposition of the precursor solution on the substrate, the water and the precursors begin to react while the precursor solution is in the storage container. After undergoing hydrolysis reaction and polycondensation reaction in the storage container, the precursor solution turns into gel which has lost fluidity and has high viscosity. Thus, it is difficult to form a thin film on the substrate by the deposition. In addition, when storing the precursor solution for prolonged period of time, the polycondensation reaction further progresses and a solid metal oxide is produced in the precursor solution. Thus, it is difficult to prolong storage of the precursor solution.

Meanwhile, in the case of forming a film without adding water to the precursor solution, hydrolysis of the precursors takes place due to the moisture included in air, but not efficiently due to an inadequate amount of water supplied. Although the precursors can be decomposed by heating, high-temperature processing at approximately 400° C. or higher is required. In this case, it is impossible to use a substrate with comparatively low heat resistance, such as a plastic substrate.

In view of this, a method for manufacturing a metal oxide semiconductor according to one aspect in the present disclosure comprises: depositing a film on a substrate from a mixed solution of at least two precursors in a solvent, wherein at least one of the precursors is a metal alkoxide; and curing the film deposited on the substrate, in a presence of an aqueous catalyst, inclusive, to form, from the mixed solution, a metal oxide semiconductor.

A method for manufacturing an amorphous metal oxide semiconductor according to another aspect in the present disclosure comprises: depositing a film on a substrate from a mixed solution of at least two precursors in a solvent, wherein one of the at least two precursors is, for example, an indium alkoxide, another of the at least two precursors is, for example, a zinc alkoxide, inclusive; and thermal-annealing the film deposited on the substrate, in a water vapor atmosphere, at a temperature range of 180 to 275 degrees Celsius, inclusive to form, from the mixed solution, an amorphous metal oxide semiconductor.

In the above aspect, the film is deposited on a substrate from the mixed solution of at least an indium alkoxide and a zinc alkoxide in a solvent. The substrate is placed in a water vapor atmosphere. Thereby, moisture is actively injected into the film made from the mixed solution, and then the film is changed into gel. In the changing into gel of the film made from the mixed solution, instead of generating water vapor using a high temperature of 400° C. or higher to inject moisture into the film, the substrate on which the film is deposited is placed in a water vapor atmosphere. Then, moisture is actively injected into the film made from the mixed solution without using a high temperature of 400° C. or higher. Since thermal annealing is performed after the injection of the moisture into the film made from the mixed solution, there is no need to perform the thermal decomposition of the precursors at a high temperature of 400° C. or higher. Even with a low temperature of between 180° C. to 275° C., inclusive, the leaving group component within the reacting system can be sufficiently removed. Therefore, the thermal annealing temperature for the film made from the mixed solution can be lowered by placing the substrate on which the film is deposited in a water vapor atmosphere, so as to actively inject moisture into the mixed solution and to change, into gel, the thin film made from the mixed solution. As a result, an amorphous metal oxide semiconductor can be formed, using a substrate with comparatively low heat resistance, such as a plastic substrate.

For example, the thermal-annealing can include: thermal-annealing in the water vapor atmosphere, at the temperature range of 180 to 275 degrees Celsius, inclusive (hereafter also referred to as first process); and thermal-annealing in a non-water vapor atmosphere, at the temperature range of 180 to 275 degrees Celsius, inclusive (hereafter also referred to as second process), after the thermal annealing in the water vapor atmosphere.

In the above aspect, the gelling is separated from the thermal annealing for actively removing the leaving group component. First, the film made from the mixed solution is changed into gel by being placed in a water vapor atmosphere, after which the thermal annealing is performed. Therefore, by separating the gelling from the thermal annealing, the thermal annealing temperature for the mixed solution can be lowered. As a result, it is possible to use a substrate with comparatively low heat resistance such as a plastic substrate.

For example, the thermal-annealing in the non-water vapor atmosphere (second process) can be performed successively after the thermal-annealing in the water vapor atmosphere (first process) is completed.

According to the above aspect, by successively performing the first process and the second process, the mesh structure of the metal oxide can be formed satisfactorily by removing the leaving group component in the non-water vapor atmosphere while supplying sufficient oxygen, and thus it is possible to form an amorphous metal oxide semiconductor having an extremely small amount of residual impurities and oxygen defects. As a result, it is possible to significantly improve and stabilize the semiconductor characteristics of the amorphous metal oxide.

For example, the thermal-annealing in the water vapor atmosphere (first process) and the thermal-annealing in the non-water vapor atmosphere (second process) can be performed at a same temperature.

According to the above aspect, the thermal annealing temperature becomes equal between the first process and the second process, and thus the process can be simplified.

For example, one of the metal precursors can be an indium alkoxide having a decomposition temperature falling within a first temperature range, and the second precursor can be a zinc alkoxide having a decomposition temperature falling within a second temperature range, the second temperature overlapping with the first temperature range.

According to the above aspect, the temperature range of the decomposition temperature of the indium alkoxide and the temperature range of the decomposition temperature of the zinc alkoxide overlap. Accordingly, since indium and zinc decompose at the same time, bonding of both metal components is promoted more effectively. As a result, the amorphous state can be stably formed and it is possible to stably form an amorphous metal oxide semiconductor as an end product.

According to the above aspect, the indium alkoxide comprises, for example, a pantameric indium alkoxide cluster, the zinc alkoxide comprises, for example, a zinc bis methoxyethoxide, and the film deposited on the substrate is thermal-annealed, in the water vapor atmosphere, at a temperature range of 210 to 275 degrees Celsius, inclusive.

According to the above aspect, the indium alkoxide comprises, for example, a pantameric indium alkoxide cluster, the zinc alkoxide comprises, for example, an alkyl component, aryl component, perfluoroakyl component, perfluoroaryl component or fluorohydrocarbon component.

According to the above aspect, the zinc alkoxide comprises, for example, Etylzinc propoxide, Etylzinc butoxide, or Etylzinc methoxyethoxide.

According to the above aspect, the mixed solution further includes other metal alkoxide precursors, included in, for example, group I, II or III metal alkoxide precursor.

According to the above aspect, the other metal alkoxide precursor comprises, for example, gallium, Barium or Strontium.

The inventors use metal alkoxides as a starting material and try forming an amorphous metal oxide semiconductor as an end product, using a sol-gel reaction. The inventors focus on the role of water in the following expression 1 indicating the hydrolysis reaction and on the following expression 2 or expression 3 indicating the polycondensation reaction. In the sol-gel reaction, the hydrolysis reaction of the metal alkoxides progresses in proportion to the amount of added water, thereby generating an intermediate product represented by the general expression $M(OR)_{x-y}(OH)$ of the expression 1. The polycondensation reaction represented by the expression 2 or the expression 3 progresses in proportion to the amount of the generated intermediate product, thereby generating the amorphous metal oxide semiconductor. Therefore, in an environment with an adequate supply of water, it is possible to promote the sol-gel reaction using thermal annealing at comparatively low temperatures. It is noted that from the expression 1 to the expression 3, M denotes metal and OR denotes an alkyl group.

$$M(OR)_x + yH_2O \rightarrow M(OR)_{x-y}(OH) + (x-y)H\text{—}OR \quad \text{(Expression 1)}$$

$$(RO)_2M\text{-}OH + HO\text{-}M(OR)_2 \rightarrow M\text{-}O\text{-}M + H_2O \quad \text{(Expression 2)}$$

$$(RO)_2M\text{-}OH + RO\text{-}M(OR)_2 \rightarrow M\text{-}O\text{-}M + R\text{—}OH \quad \text{(Expression 3)}$$

In an environment with an adequate supply of water, thermal annealing can be performed using a temperature, the temperature being sufficient for dispersing (i) the organic substance which is represented by the general expression R-OH and is the by-product of the sol-gel reaction, or (ii) $H_2O$ (removing the leaving group component within the reacting system to bias the balance of the reaction to the product-side). The temperature is also significantly lower compared to the temperature in the thermal decomposition of precursors using only heating. The inventors arrived at easily depositing and forming a thin film by depositing a metal alkoxide solution, as a starting material, on a substrate, with the fluidity of the solution being maintained without the addition of water. The sol-gel reaction of the metal alkoxide is subsequently promoted by exposure, the substrate on which the metal alkoxide solution is deposited, in a water vapor atmosphere, and then an amorphous metal oxide semiconductor is obtained at low temperature. As explained above, the inventors arrived at the exemplary embodiment and features disclosed herein.

With this, the exemplary embodiment and features disclosed herein have succeeded in forming an amorphous metal oxide semiconductor with excellent film characteristics as an end product by using, as a starting material, a mixed solution of at least an indium alkoxide and a zinc alkoxide in a solvent, and performing, as an intermediate process, thermal annealing at a temperature between 210° C. and 275° C., inclusive, in a water vapor atmosphere, after forming the thin film on the substrate by deposition.

For example, the intermediate process can be divided into a first process and a second process. Thermal annealing is performed at a temperature between 210° C. and 275° C., inclusive, in a water vapor atmosphere in the first process, and thermal annealing is performed at a temperature between 210° C. and 275° C., inclusive, in a non-water vapor atmosphere in the second process.

The features here are the following:
(1) performing thermal annealing at a temperature between 210° C. and 275° C., inclusive, in the water vapor atmosphere; and
(2) combining both the first process in a water vapor atmosphere and the second process in a non-water vapor atmosphere, and performing the first process and the second process successively.

According to feature (1), water is actively supplied to the thin film made from the mixed solution of the indium alkoxide and the zinc alkoxide in the solvent. With this, the thin film changes into gel, and thermal annealing is successively performed in the state in which water is actively supplied.

In this regard, conventionally, the thin film made from the mixed solution of the indium alkoxide and the zinc alkoxide in the solvent is thermal-annealed at a high temperature of 400° C., and the decomposition of the precursors is promoted mainly by thermal decomposition, to change the thin film into gel. In other words, both the gelling and the thermal annealing for actively removing the leaving group component are performed by utilizing high temperature.

In contrast, in the present disclosure, the substrate on which the film made from the mixed solution is deposited is placed in a water vapor atmosphere, thereby actively injecting moisture into the mixed solution, and thus changing into gel the thin film made from the mixed solution.

At this point, instead of generating water vapor in the process of thermal annealing at a high temperature of 400° C. or higher and changing the thin film made from the mixed solution into gel through such water vapor, moisture is actively injected into the mixed solution by placing in a water vapor atmosphere the substrate on which the film made from the mixed solution is deposited. Since thermal annealing is performed in the state in which moisture is actively injected, there is no need to carry out the thermal decomposition of the precursors in a high temperature of 400° C. or higher. As such, gelling can be sufficiently advanced even with a low temperature of between 210° C. and 275° C., inclusive. The thermal annealing temperature for the mixed solution can be lowered by placing in a water vapor atmosphere the substrate on which the film made from the mixed solution is deposited so as to actively inject moisture into the mixed solution and to change into gel the thin film made from the mixed solution.

In addition, in an exemplary embodiment in the present disclosure, the gelling is separated from the thermal annealing for actively removing the leaving group component. In other words, first, the thin film made from the mixed solution is changed into gel by being placed the thin film in a water vapor atmosphere, after which the thermal annealing is performed. As such, even with a low temperature of between 210° C. to 275° C., inclusive, the leaving group component within the reacting system can be sufficiently removed. In other words, by separating the gelling from the thermal annealing, the thermal annealing temperature for the mixed solution can be lowered.

In addition, according to feature (2), by successively performing the first process and the second process, the mesh structure of the metal oxide can be formed satisfactorily by removing the leaving group component in the non-water vapor atmosphere while supplying sufficient oxygen, and thus it is possible to form an amorphous metal oxide semiconductor having an extremely small amount of residual impurities and oxygen defects. As a result, it is also possible to significantly improve and stabilize semiconductor characteristics such as mobility, hysteresis, and so on.

Hereinafter, certain exemplary embodiments are described in greater detail with reference to the accompanying Drawings.

Each of the exemplary embodiment and the modifications thereof described below shows a general or specific example. The numerical values, shapes, materials, structural elements, the arrangement and connection of the structural elements, steps, the processing order of the steps etc. shown in the following exemplary embodiment and modifications thereof are mere examples, and therefore do not limit the scope of the appended Claims and their equivalents. Therefore, among the structural elements in the following exemplary embodiment and modifications thereof, structural elements not recited in any one of the independent claims are described as arbitrary structural elements.

Embodiment

Hereinafter, a method for manufacturing the amorphous metal oxide semiconductor in an exemplary embodiment in the present disclosure shall be described with reference to the Drawings. In the subsequent Drawings, constituent elements having substantively the same functions are given the same reference sign in order to simplify description.

FIG. 1 is a cross-sectional view for schematically describing a method for manufacturing a thin film transistor device according to the embodiment.

First, as shown in (a) in FIG. 1, a substrate 10 made from, for example, silica glass, plastic, and so on, is prepared.

Next, as shown in (b) in FIG. 1, a gate electrode 11 is formed on the substrate 10. For example, after a metal film made from a metal such as molybdenum tungsten (MoW) and the like is formed on the substrate 10 by sputtering, and the like, wet-etching using a photoresist mask (not illustrated) is performed and the metal film is patterned into a predetermined shape. The metal film on which patterning is performed is formed as the gate electrode 11.

Next, as shown in (c) in FIG. 1, a gate insulation film 12 made from silicon oxide (SiOx), silicon nitride (SiNy), stacked layers thereof, and so on, is formed on the gate electrode 11.

Next, as shown in (d) in FIG. 1, an amorphous metal oxide semiconductor layer 13 is formed on the gate insulation film 12, as a channel layer, using the sol-gel method. The details of the method for forming the amorphous metal oxide semiconductor layer 13 shall be described later.

Next, as shown in (e) in FIG. 1, wet-etching using a photoresist mask (not illustrated), and so on, is performed on the amorphous metal oxide semiconductor layer 13, and the amorphous metal oxide semiconductor layer 13 is patterned into a predetermined shape.

Next, as shown in (f) in FIG. 1, a source electrode 14 and a drain electrode 15 are formed apart, each on an opposite end of the amorphous metal oxide semiconductor layer 13 in the channel direction, by sputtering and so on. Each of the source electrode 14 and the drain electrode 15 is a single-layer structure or multilayer structure of a conductive material, alloy, and so on, and includes, for example, aluminum (Al), molybdenum (Mo), tungsten (W), Copper (Cu), molybdenum tungsten (MoW), titanium (Ti), chrome (Cr), and so on.

Lastly, as shown in (g) in FIG. 1, a passivation film 16 is formed so as to cover the entirety of the thin film transistor device.

FIG. 2 is a cross-sectional view showing details of the process of forming the amorphous metal oxide semiconductor layer 13 (process shown in (d) in FIG. 1) in the above-described method for manufacturing a thin film transistor device.

First, as shown in (a) in FIG. 2, a metal alkoxide solution 20 serving as a mixed solution including at least an indium alkoxide and a zinc alkoxide is deposited on the substrate 10 (specifically, on the gate insulation film 12).

Next, as shown in (b) in FIG. 2, thermal annealing is performed on the metal alkoxide solution 20 deposited on the substrate 10, in a water vapor atmosphere and at a temperature range of 210° C. to 275° C., inclusive, and hydrolysis reaction of the sol-gel reaction is promoted by active injection of moisture into the metal alkoxide solution 20. With this, a hydrolyzed thin film 21 is formed. In addition, by continuing the thermal annealing at a temperature between 210° C. and 275° C., inclusive, in a water vapor atmosphere, the polycondensation reaction of the sol-gel reaction progresses and a polycondensated, gelled thin film 22 is formed, as shown in (c) in FIG. 2.

Here, "in a water vapor atmosphere" refers to a state in which moisture is actively added to (injected into) the metal alkoxide solution 20, and means, for example, in humidity that is higher than the humidity of the atmosphere in which the forming process of the amorphous metal oxide semiconductor layer is performed. Such a state is realized by constantly controlling the humidity in the container in which the forming of the amorphous metal oxide semiconductor layer 13 is performed so as to be higher than atmospheric humidity, that is, increasing the humidity to 100% for example, or by spraying water vapor onto the metal alkoxide solution 20 deposited on the substrate 10.

Next, as shown in (d) in FIG. 2, thermal annealing is performed on the gelled thin film 21 (the metal alkoxide solution 20 deposited on the substrate 10), in a non-water vapor atmosphere and at a temperature range of 210° C. to 275° C., inclusive, successively after the processes in (b) and (c) in FIG. 2. With this, the leaving group component such as organic substances, $H_2O$, and so on are actively removed so that the polycondensation reaction is further promoted, and thus the amorphous metal oxide semiconductor layer 13 is generated from the mixed solution as the end product of the sol-gel reaction.

Here, "in a non-water vapor atmosphere" refers to a state in which moisture is not actively added to the metal alkoxide solution 20, and means, for example, in the humidity of the atmosphere in which the forming process of the amorphous metal oxide semiconductor layer is performed. Such a state is realized by constantly controlling the humidity in the container in which the forming of the amorphous metal oxide semiconductor layer 13 is performed so as to be equal to atmospheric humidity, or by performing thermal annealing on the metal alkoxide solution 20 deposited on the substrate 10, in air.

It is to be noted that the hydrolysis reaction and the polycondensation reaction in the sol-gel reaction are shown by being separated into the different processes shown in (b) in FIG. 2 and (c) in FIG. 2. However, since the hydrolysis reaction and the polycondensation reaction proceed successively in the sol-gel reaction, the processes in (b) in FIG. 2 and (c) in FIG. 2 may be united in a single process of performing thermal annealing on the metal alkoxide solution 20 deposited on the substrate 10, at a temperature between 210° C. and 275° C., inclusive, in a water vapor atmosphere.

Furthermore, in the case where the amorphous metal oxide semiconductor layer 13 is to be generated as an end product by thermal annealing at a temperature range of 210° C. and 275° C., inclusive, in the processes shown in (b) in FIG. 2 and (c) in FIG. 2, the process of thermal annealing in a non-water vapor atmosphere shown in (d) in FIG. 2 need not be performed. Therefore, hereinafter, when thermal annealing is mentioned alone, this indicates thermal annealing for obtaining the amorphous metal oxide semiconductor layer 13 from the metal alkoxide solution 20, without distinguishing between the thermal annealing in the water vapor atmosphere shown in (b) in FIG. 2 and (c) in FIG. 2 (hereafter denoted as wet annealing) and the thermal annealing in the non-water vapor atmosphere shown in (d) in FIG. 2 (hereafter denoted as dry-annealing).

Figure 3A:
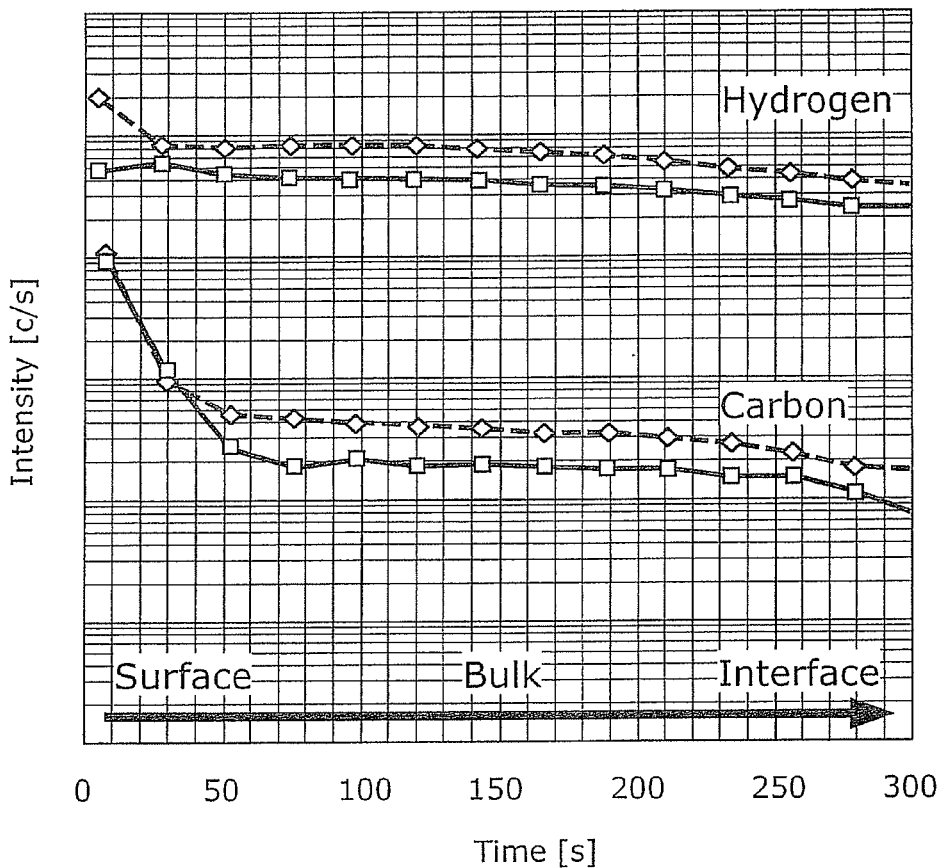
FIG. 3A is a graph showing the concentration distribution of carbon and hydrogen in a depth direction of an amorphous metal oxide semiconductor layer.
Figure 3B:
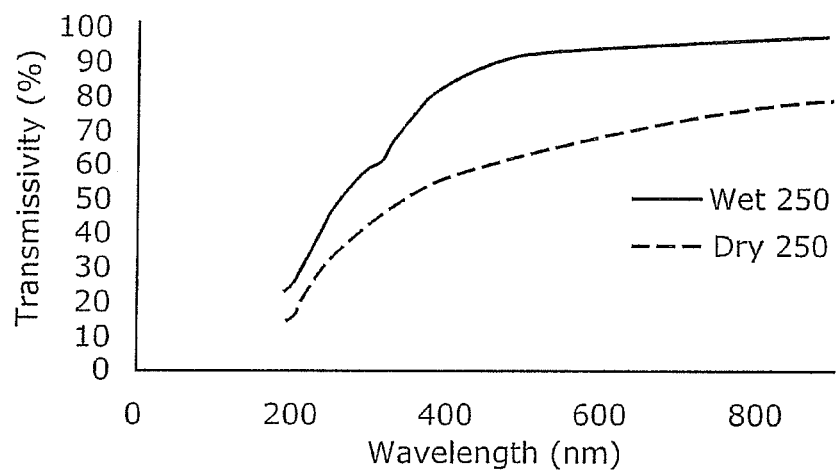
FIG. 3B is a graph showing the wavelength dependency of the transmissivity of the amorphous metal oxide semiconductor layer.

FIG. 3A is a graph showing the concentration distribution of carbon (C) and hydrogen (H) in a depth direction (thickness direction) obtained by Secondary Ion Mass Spectrometry (SIMS) of an amorphous metal oxide semiconductor layer in a thin film transistor device. FIG. 3B is a graph showing the wavelength dependency of the transmissivity of the amorphous metal oxide semiconductor layer.

It is to be noted that, in FIG. 3A and FIG. 3B, a solid line denotes the concentration distribution in the thin film transistor device according to the present embodiment that is manufactured according to the method in (a) to (g) in FIG. 1 with the thermal annealing temperature at 250° C., and a broken line denotes the concentration distribution in a conventional thin film transistor device with the thermal annealing temperature at 250° C.

Furthermore, in FIG. 3A, time, which is the horizontal axis, corresponds to the depth of the amorphous metal oxide semiconductor layer, and thus 0 min indicates the surface of the amorphous metal oxide semiconductor layer and 300 min indicates the interface with the gate insulation film.

It can be seen from FIG. 3A that, compared to the conventional amorphous metal oxide semiconductor layer, in the amorphous metal oxide semiconductor layer according to the present embodiment, the carbon concentration at the interface with the gate insulation film is low and the impurity concentration is low. Furthermore, it can be seen from FIG. 3B that, compared to the conventional amorphous metal oxide semiconductor layer, in the amorphous metal oxide semiconductor layer according to the present embodiment, transmissivity is high overall and thus the impurity concentration is low. Therefore, it can be seen that the amorphous metal oxide semiconductor layer according to the present embodiment has a configuration that can realize high on current.

Figure 3C:
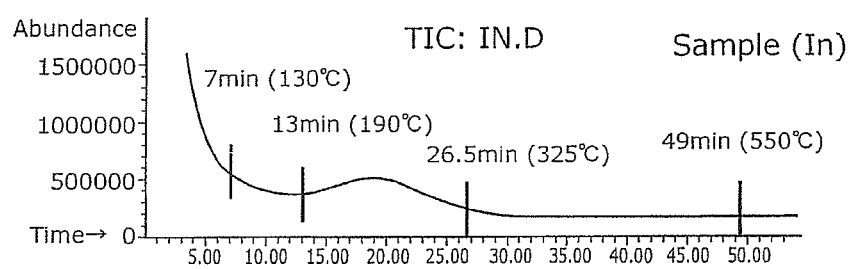
FIG. 3C is a graph showing the time change of the mass of an indium alkoxide solution (time change for the amount of generated gas).
Figure 3D:
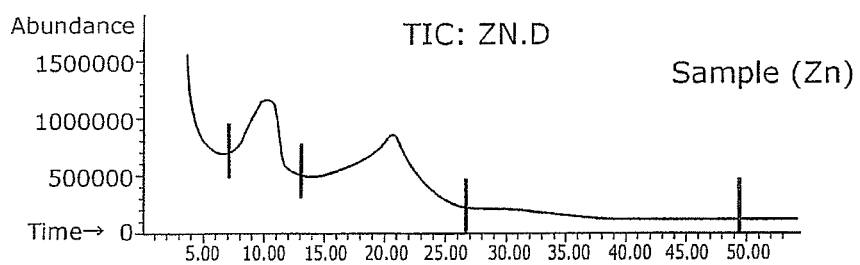
FIG. 3D is a graph showing the time change of the mass of a zinc alkoxide solution (time change for the amount of generated gas).

FIG. 3C is a graph showing the relative time change for the mass of gas generated from 5 mg of indium alkoxide solution within a furnace indicating a 10° C./min time change, for deriving the decomposition temperature of the indium alkoxide solution included in the metal alkoxide solution 20. FIG. 3D is a graph showing the relative time change for the mass of gas generated from 5 mg of zinc alkoxide solution within a furnace indicating a 10° C./min time change, for deriving the decomposition temperature of the zinc alkoxide solution included in the metal alkoxide solution 20.

It can be seen from FIG. 3C that, with the indium alkoxide solution included in the metal alkoxide solution 20, a gas generated when the indium alkoxide solution is decomposed is generated between 190° C. and 325° C., inclusive, and thus the indium alkoxide solution is an anhydrous alcohol solution of indium alkoxide, which has a decomposition temperature range of 190° C. to 325° C., inclusive (first temperature range). Furthermore, it can be seen from FIG. 3C that, with the zinc alkoxide solution included in the metal alkoxide solution 20, a gas generated when the zinc alkoxide solution is decomposed is generated between 190° C. and 325° C., inclusive, and thus the zinc alkoxide solution is an anhydrous alcohol solution of zinc alkoxide, which has a decomposition temperature range of 190° C. to 325° C., inclusive, (second temperature range) which overlaps with the first temperature range. Therefore, it can be inferred that, since the indium alkoxide solution and the zinc alkoxide solution have similar reactivity and decompose at around the same time, the bonding between indium and zinc is promoted in the sol-gel reaction.

Hereinafter, results of the evaluation of the characteristics of the thin film transistor device according to the present embodiment that is manufactured according to the method in FIG. 1 shall be shown in FIG. 4A to FIG. 4B, FIG. 5A to FIG. 5F, FIG. 6A to FIG. 6C, FIG. 7A to FIG. 7D, FIG. 9A to FIG. 9F, FIG. 11A to FIG. 11E, FIG. 13A to FIG. 13C, and FIG. 14A to FIG. 14C. Furthermore, FIG. 4C to FIG. 4E show the results of the evaluation of the characteristics of a thin film transistor device serving as a comparative example for when an amorphous metal oxide semiconductor layer is formed by promoting the sol-gel reaction at high temperature in a non-water vapor atmosphere.

It is to be noted that the characteristics of the thin film transistor device in the present embodiment can be represented using the parameters of mobility, hysteresis, and turn-on voltage. Mobility can be extracted from the slope of the drain current ($I_D$)-gate voltage ($V_{GS}$) characteristics. Hysteresis is the difference between the two gate voltages at 10 nA drain current in both the gate voltage dependency of the drain current when the gate voltage is changed from negative to positive and the gate voltage dependency of the drain current when the gate voltage is changed from positive to negative. Furthermore, turn-on voltage indicates the rise voltage of on characteristics and is defined as the gate voltage at which the slope of log ($I_D$)-$V_{GS}$ is maximum.

Figure 4A:
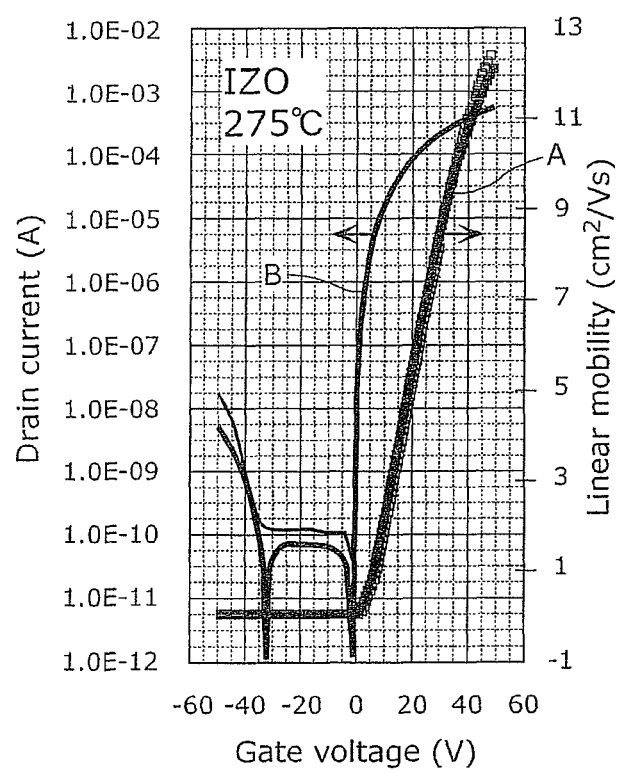
FIG. 4A is a graph showing the gate voltage dependency of the mobility and drain current of a thin film transistor device according to the embodiment.
Figure 4B:
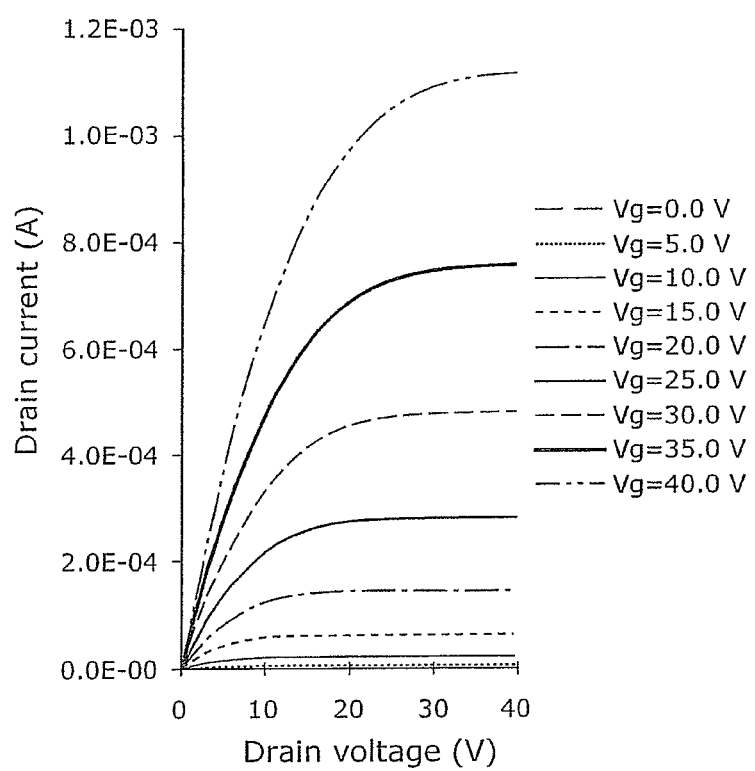
FIG. 4B is a graph showing, for each of different gate voltages, the drain voltage dependency of the drain current of a thin film transistor device.
Figure 4C:
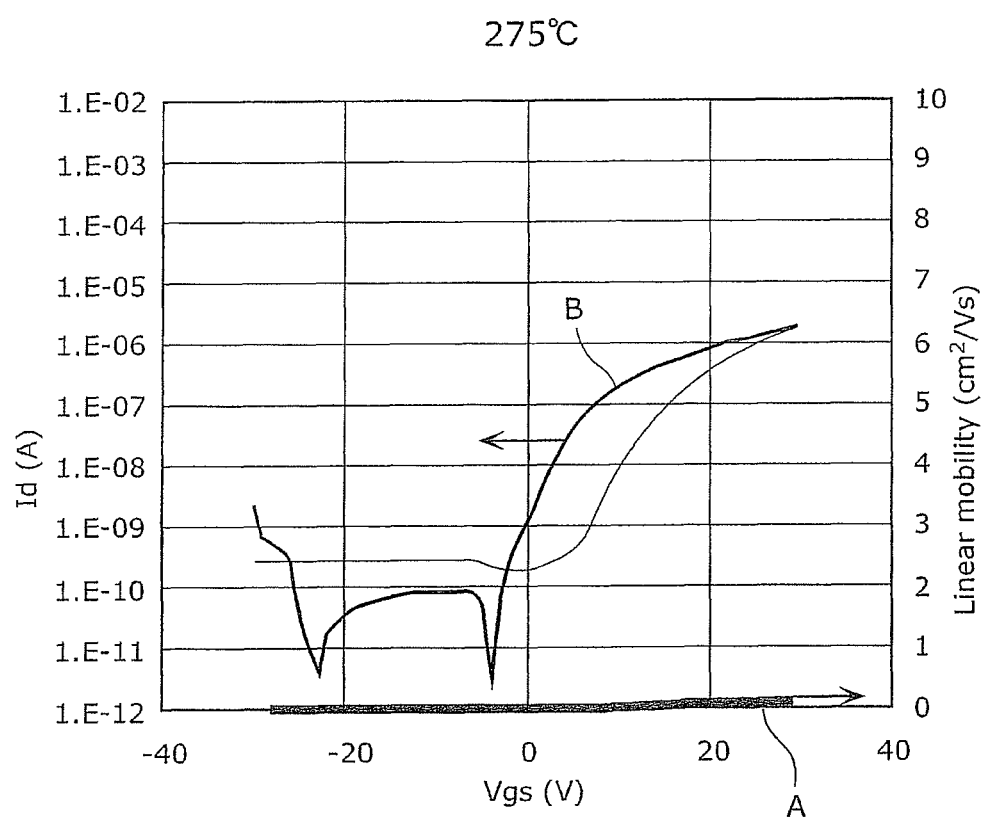
FIG. 4C is a graph showing the gate voltage dependency of the mobility and drain current of a thin film transistor device as a comparative example.
Figure 4E:
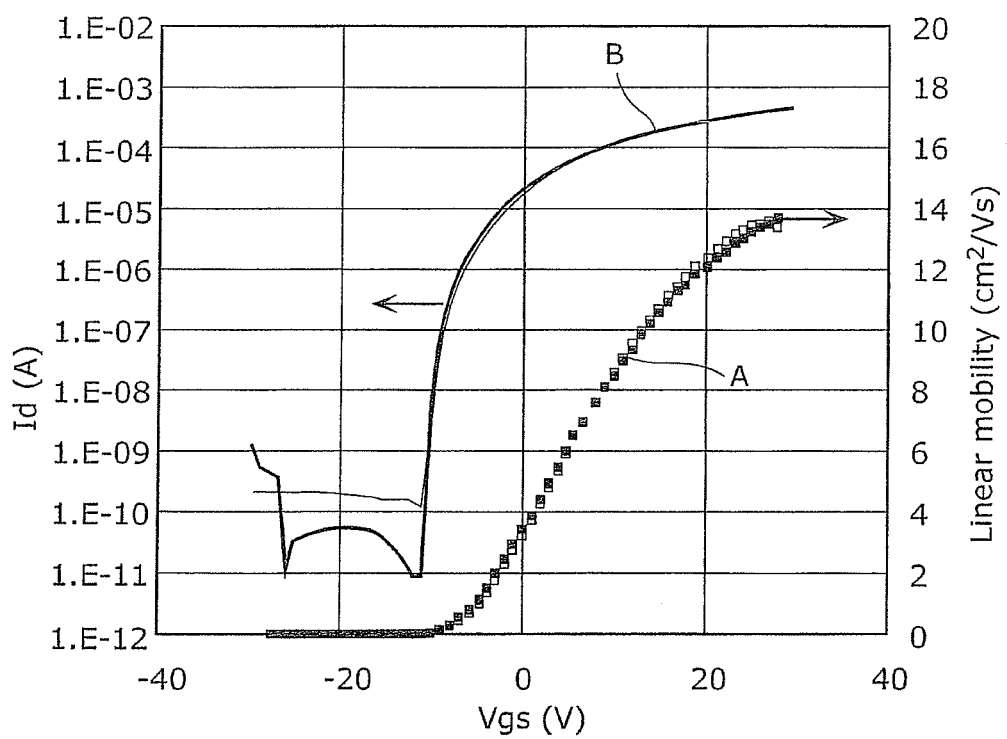
FIG. 4E is a graph showing the gate voltage dependency of the mobility and drain current of a thin film transistor device as a comparative example.

FIG. 4A is a graph showing the gate voltage dependency of the mobility and drain current of the thin film transistor device when the thermal annealing temperature is set to 275° C. In FIG. 4A, the gate voltage dependency of mobility (A in FIG. 4A) is shown using black and white squares ("■", "□"), and the gate voltage dependency of the drain current (B in FIG. 4A) is shown using a solid line. FIG. 4B is a graph showing the drain voltage dependency of the drain current of the thin film transistor device, for each of different gate voltages.

Here, in the manufacturing of the thin film transistor device according to FIG. 4A, thermal annealing is performed in a water vapor atmosphere and thus the aforementioned wet annealing is performed. It is to be noted that, with regard to FIG. 4A, as a result of extracting the turn-on voltage and the mobility based on the above-described definitions, the turn-on voltage Von is 0V and the maximum mobility is 12.09 cm$^2$/Vs.

On the other hand, FIG. 4C to FIG. 4E correspond to comparative examples to FIG. 4A and FIG. 4B, and are graphs respectively showing the gate voltage dependency of the mobility and drain current of a thin film transistor device when the thermal annealing temperature is set to 275° C., 350° C., and 450° C. In FIG. 4C to FIG. 4E, the gate voltage dependency of mobility (A in FIG. 4C to FIG. 4E) is shown using black and white squares ("■", "□"), and the gate voltage dependency of the drain current is shown using a solid line. Here, unlike in the case of FIG. 4A, in the manufacturing of the thin film transistor device according to FIG. 4C to FIG. 4E, thermal annealing is not performed in a water vapor atmosphere and thus the dry annealing is performed. At this time, the dry annealing time is 2 hr.

It is to be noted that, with regard to FIG. 4C to FIG. 4E, as a result of extracting the turn-on voltage and the mobility based on the above-described definitions, the turn-on voltage Von is −4V and the maximum mobility is 0.06 cm$^2$/Vs in the thin film transistor device in FIG. 4C. In the thin film transistor device in FIG. 4D, the turn-on voltage Von is −1V and the maximum mobility is 1.4 cm$^2$/Vs. In the thin film transistor device in FIG. 4E, the turn-on voltage Von is −12V and the maximum mobility is 13.8 cm$^2$/Vs.

It can be seen from FIG. 4A and FIG. 4B that, in the thin film transistor device according to the present embodiment, mobility exceeding that in the conventional thin film transistor device using amorphous silicon, that is, a mobility of 1 cm$^2$/Vs or more, is realized with the low thermal annealing temperature of 275° C.

Furthermore, it can be seen that, compared to the thin film transistor device manufactured using the sol-gel method using only the dry annealing process (FIG. 4C to FIG. 4E), satisfactory characteristics in terms of turn-on voltage, hysteresis, and mobility, are realized in the thin film transistor device according to the present embodiment.

Figure 11A:
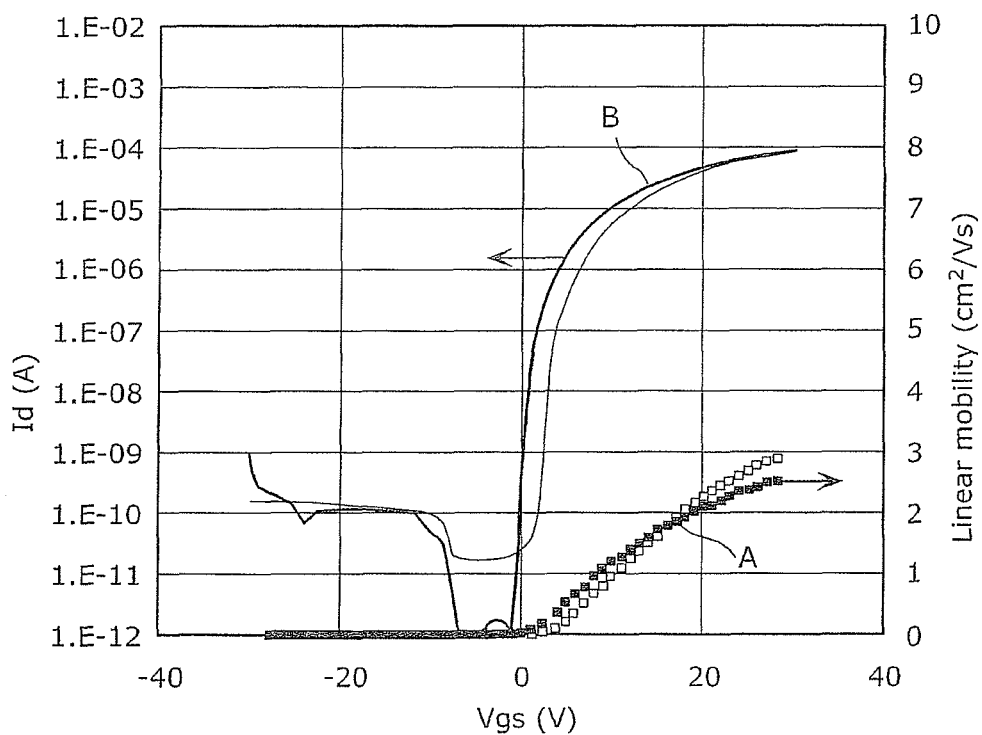
FIG. 11A is a graph showing the gate voltage dependency of the mobility and drain current of a thin film transistor device according to the embodiment.
Figure 11B:
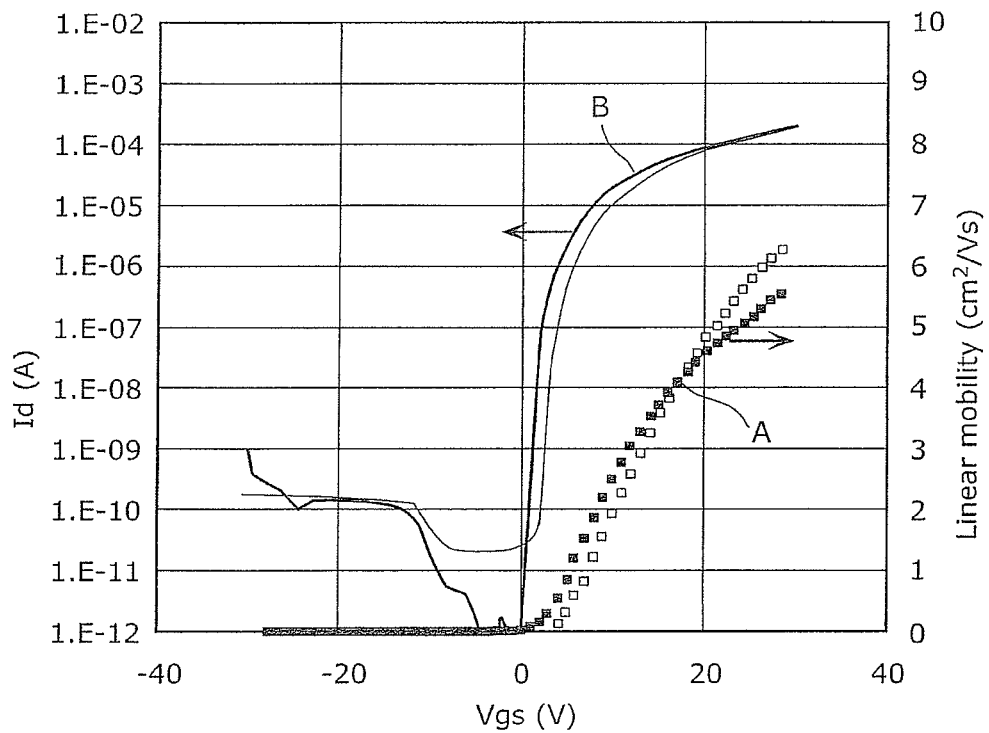
FIG. 11B is a graph showing the gate voltage dependency of the mobility and drain current of a thin film transistor device according to the embodiment.
Figure 11C:
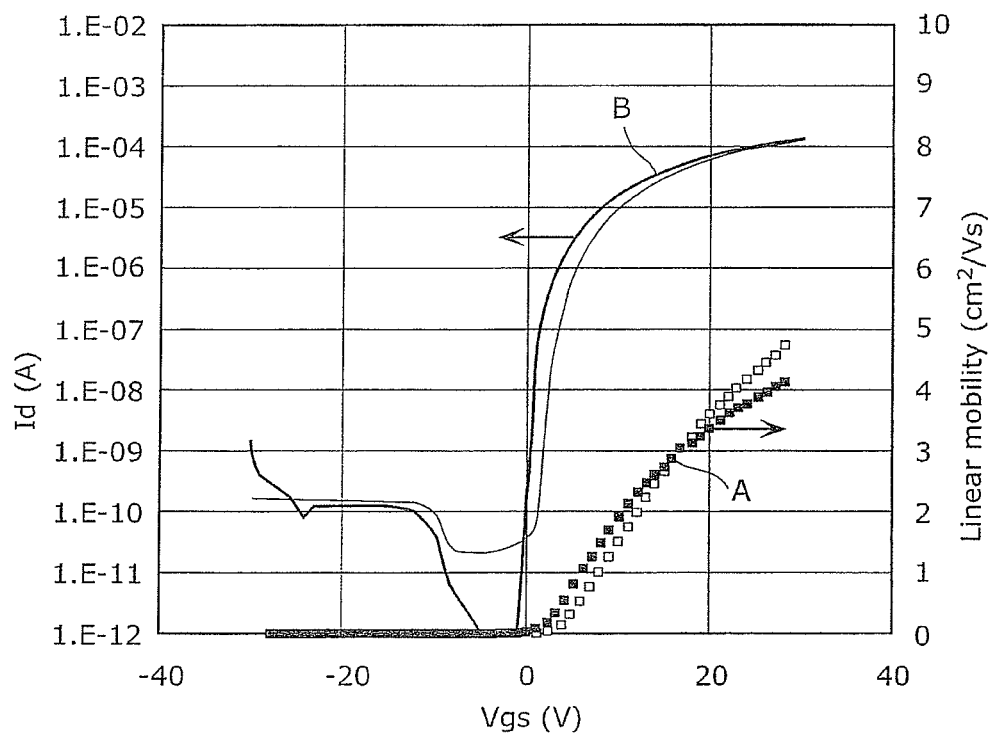
FIG. 11C is a graph showing the gate voltage dependency of the mobility and drain current of a thin film transistor device according to the embodiment.
Figure 11D:
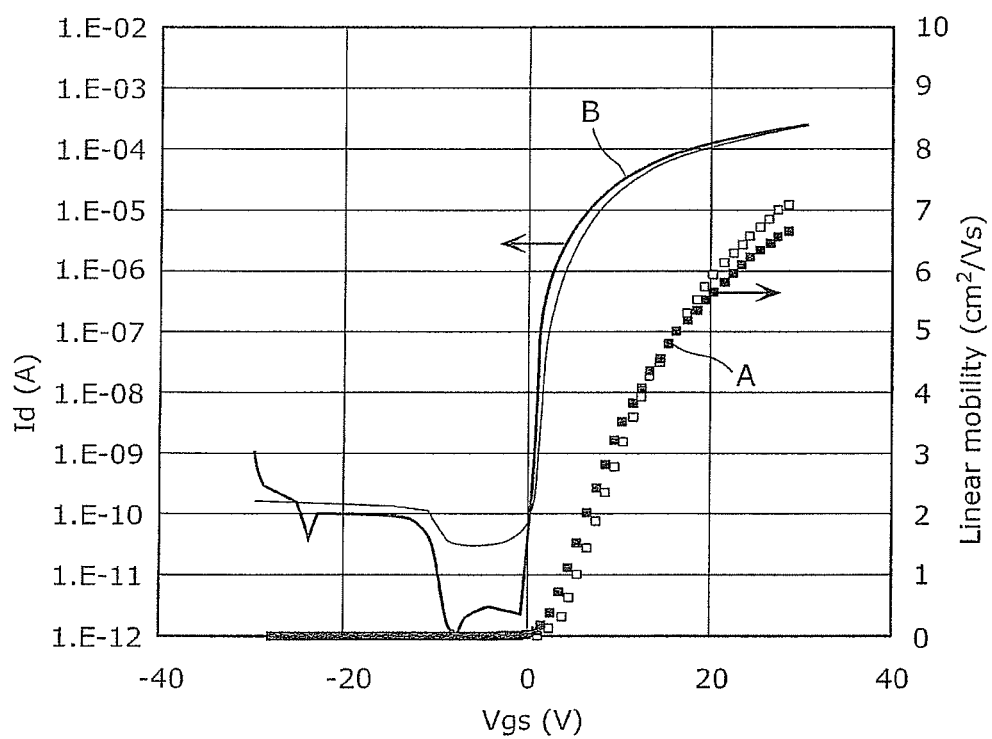
FIG. 11D is a graph showing the gate voltage dependency of the mobility and drain current of a thin film transistor device according to the embodiment.
Figure 11E:
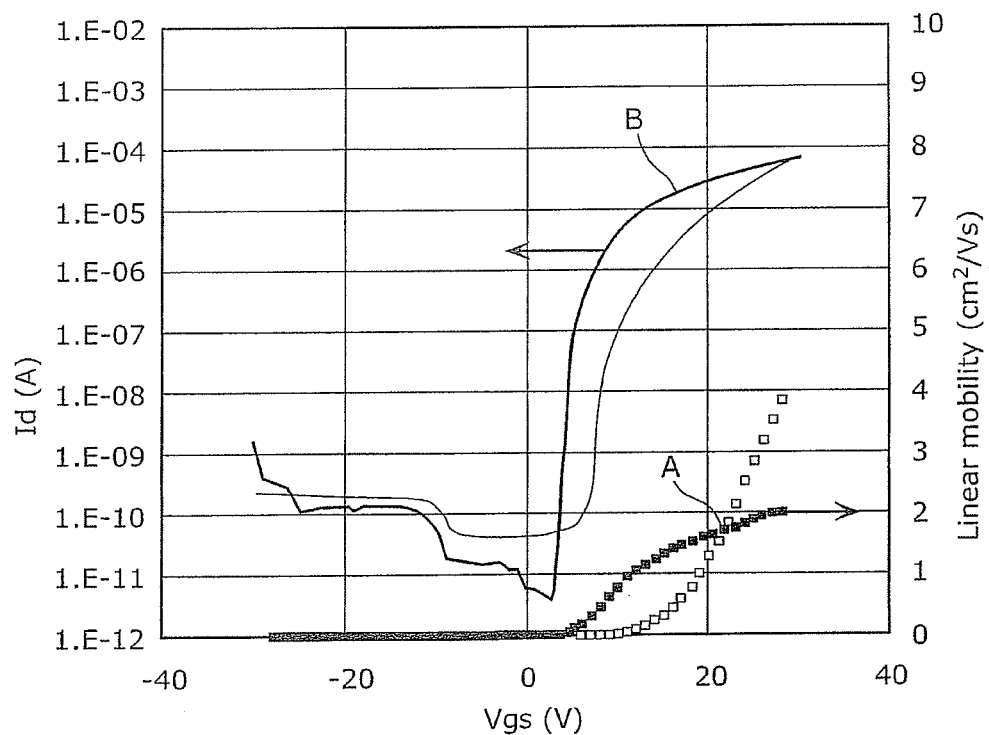
FIG. 11E is a graph showing the gate voltage dependency of the mobility and drain current of a thin film transistor device according to the embodiment.

It is to be noted that although only wet annealing is performed as an annealing process and the annealing temperature is 275° C. in the present embodiment according to FIG. 4A and FIG. 4B, the wet annealing temperature may be a temperature that is even lower than 275° C., for example 230° C. As shown in FIG. 11A described later, it can be seen that in the present embodiment, mobility exceeding that in the conventional thin film transistor device using amorphous silicon, that is, a mobility of 1 cm$^2$/Vs or more is realized, and satisfactory characteristics in terms of turn-on voltage, hysteresis, and mobility, are realized compared to FIG. 4C to FIG. 4E.

As such, in an implementation in which only wet annealing is performed as the annealing process, satisfactory characteristics can be obtained when the wet annealing temperature is at least between 230° C. and 275° C., inclusive. It is to be noted that, taking into account the other implementations described hereafter, it is considered that satisfactory characteristics can be obtained as long as the lower limit for the annealing temperature is 210° C.

Figure 5A:
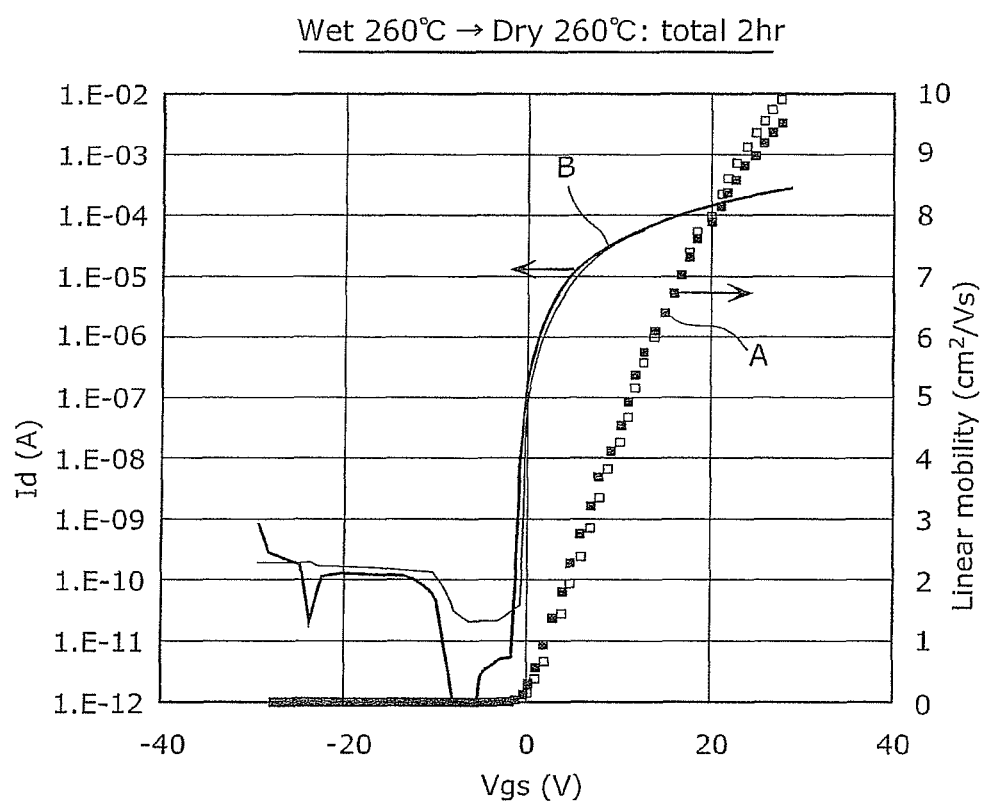
FIG. 5A is a graph showing the gate voltage dependency of the mobility and drain current of a thin film transistor device according to the embodiment.
Figure 5B:
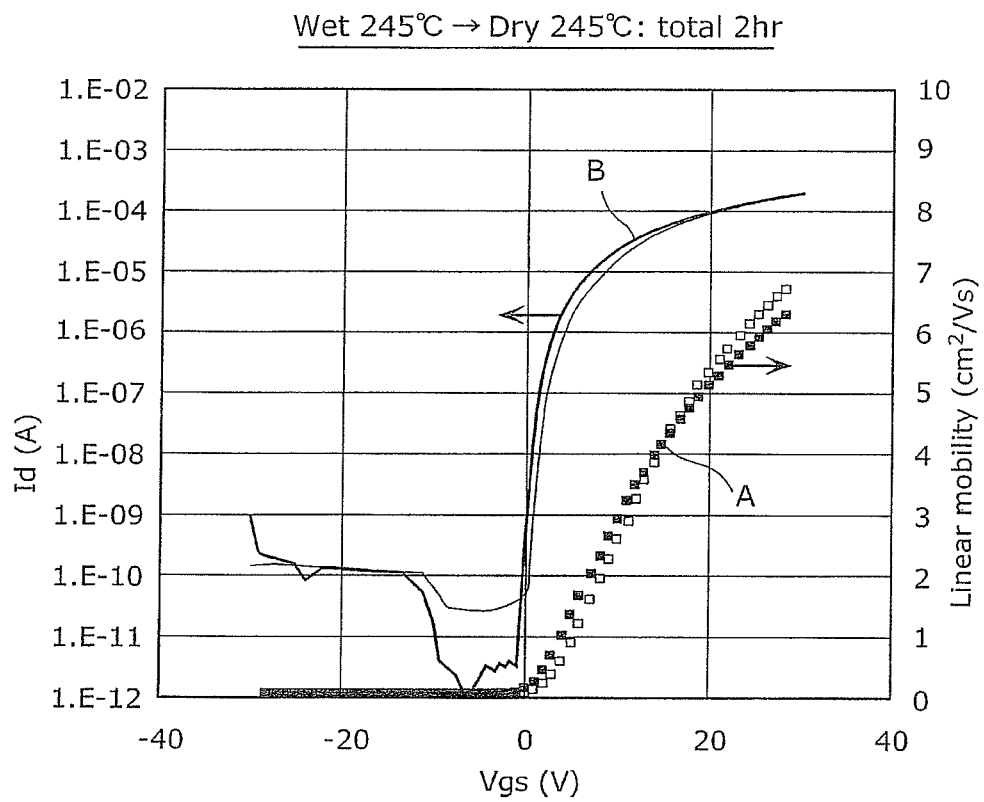
FIG. 5B is a graph showing the gate voltage dependency of the mobility and drain current of a thin film transistor device according to the embodiment.
Figure 5C:
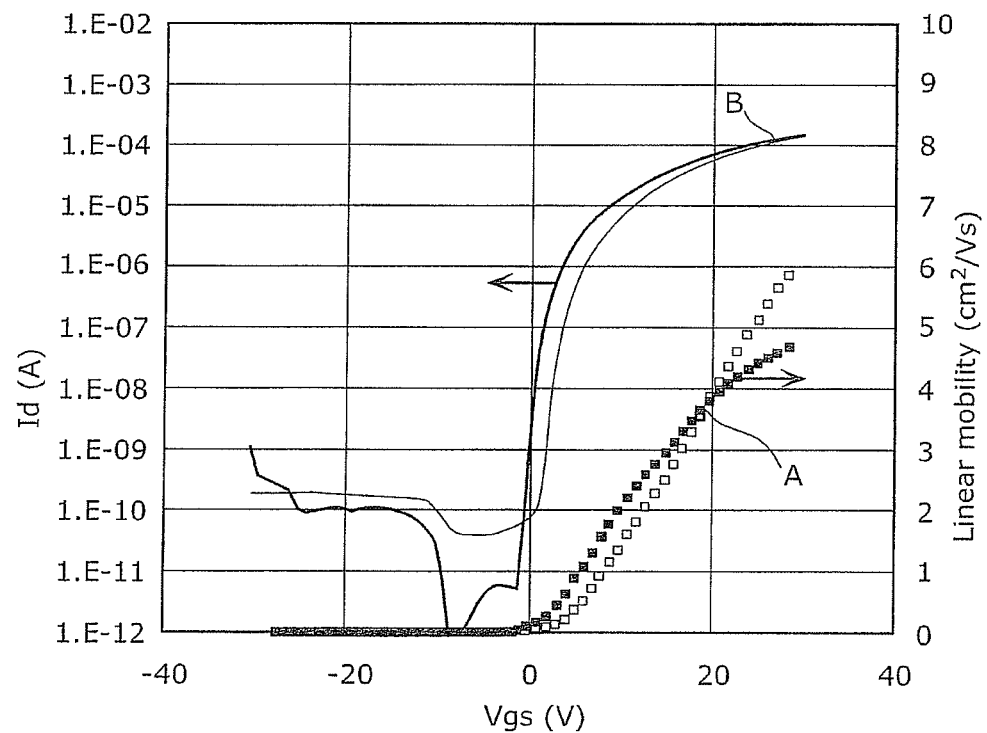
FIG. 5C is a graph showing the gate voltage dependency of the mobility and drain current of a thin film transistor device according to the embodiment.
Figure 5D:
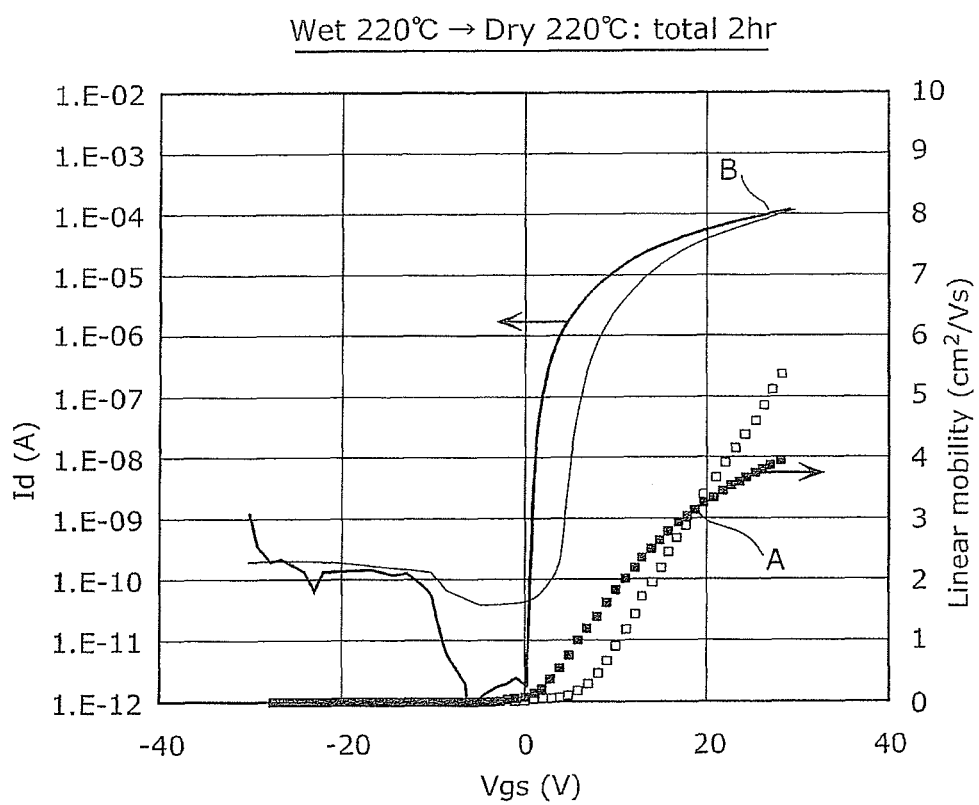
FIG. 5D is a graph showing the gate voltage dependency of the mobility and drain current of a thin film transistor device according to the embodiment.
Figure 5E:
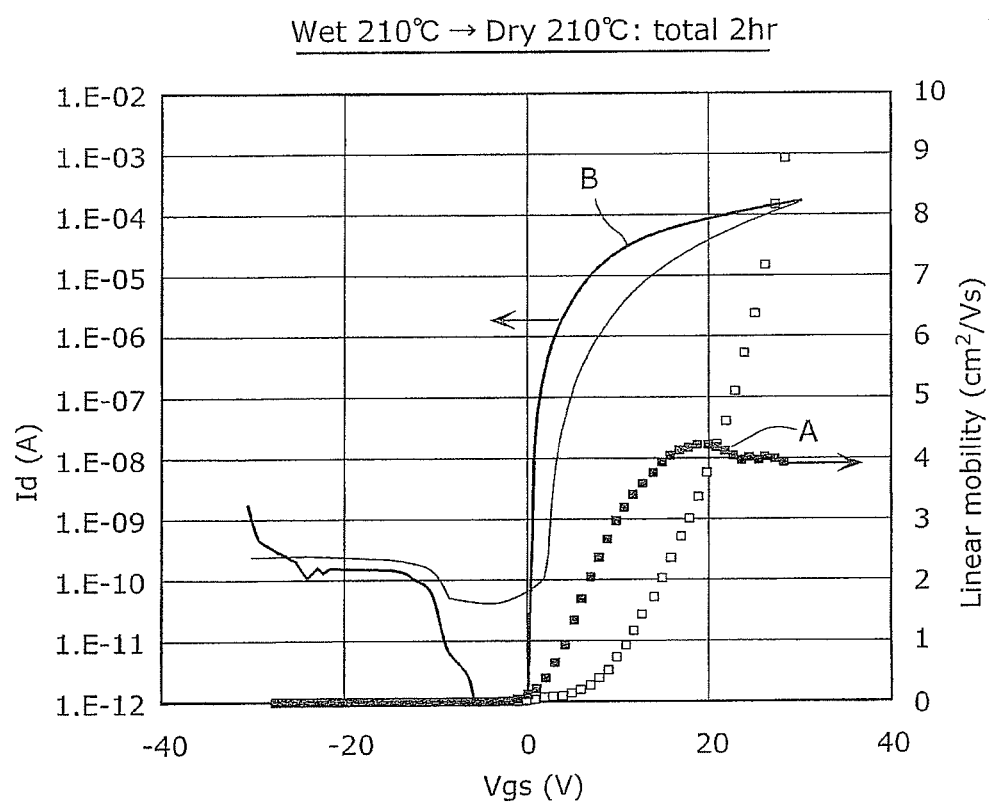
FIG. 5E is a graph showing the gate voltage dependency of the mobility and drain current of a thin film transistor device according to the embodiment.

FIG. 5A is a graph showing the gate voltage dependency of the mobility and drain current of a thin film transistor device when thermal annealing is performed for two hours at a temperature of 260° C. Similarly, FIG. 5B to FIG. 5F are graphs respectively showing the gate voltage dependency of the mobility and drain current of a thin film transistor device when thermal annealing is performed for two hours at temperatures of 245° C., 230° C., 220°, C210° C., and 200° C. In FIG. 5A to FIG. 5F, the gate voltage dependency of mobility (A in FIG. 5A to FIG. 5F) is shown using black and white squares ("■", "□"), and the gate voltage dependency of the drain current (B in FIG. 5A to FIG. 5F) is shown using a solid line.

It is to be noted that, as a result of extraction based on the above-described definition of the respective characteristics, in the thin film transistor device in FIG. 5A, the turn-on voltage Von is −1V, hysteresis is 0.7V, and maximum mobility is 9.6 cm$^2$/Vs. In the thin film transistor device in FIG. 5B, the turn-on voltage Von is 0V, hysteresis is 0.8V, and maximum mobility is 6.2 cm$^2$/Vs. In the thin film transistor device in FIG. 5C, the turn-on voltage Von is 0V, hysteresis is 1.9V, and maximum mobility is 4.6 cm$^2$/Vs. In the thin film transistor device in FIG. 5D, the turn-on voltage Von is 1V, hysteresis is 4.1V, and maximum mobility is 3.9 cm$^2$/Vs. In the thin film transistor device in FIG. 5E, the turn-on voltage Von is 1V, hysteresis is 2.4V, and maximum mobility is 4.3 cm$^2$/Vs. In the thin film transistor device in FIG. 5F, the turn-on voltage Von is −2V, hysteresis is 21V, and maximum mobility is 0.1 cm$^2$/Vs.

Figure 5F:
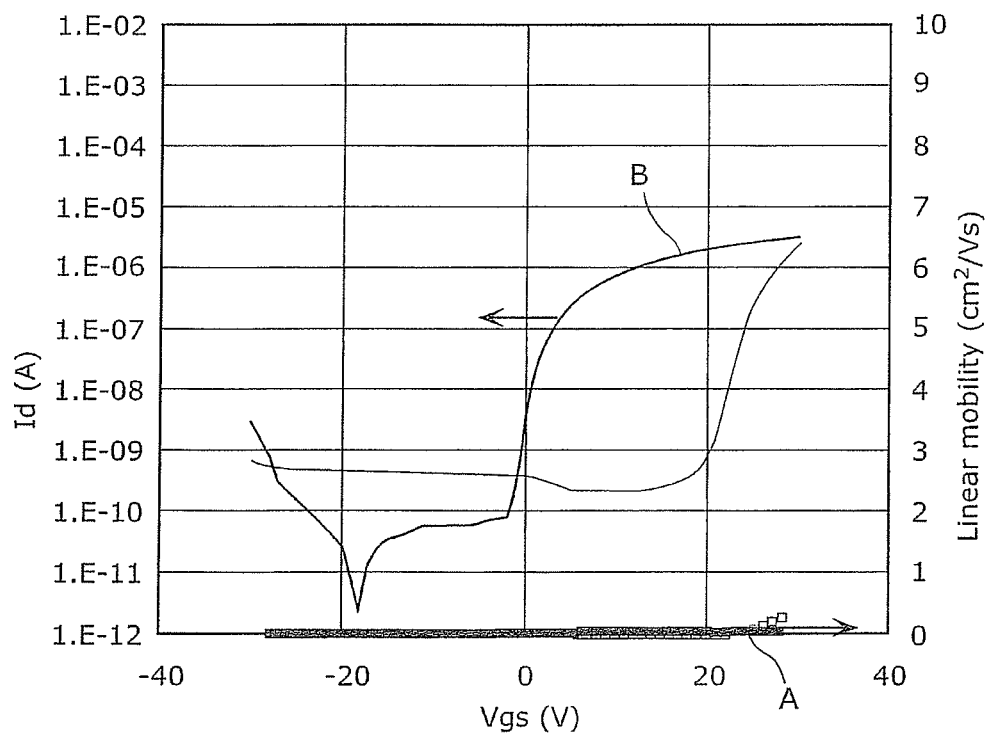
FIG. 5F is a graph showing the gate voltage dependency of the mobility and drain current of a thin film transistor device according to the embodiment.
Figure 6A:
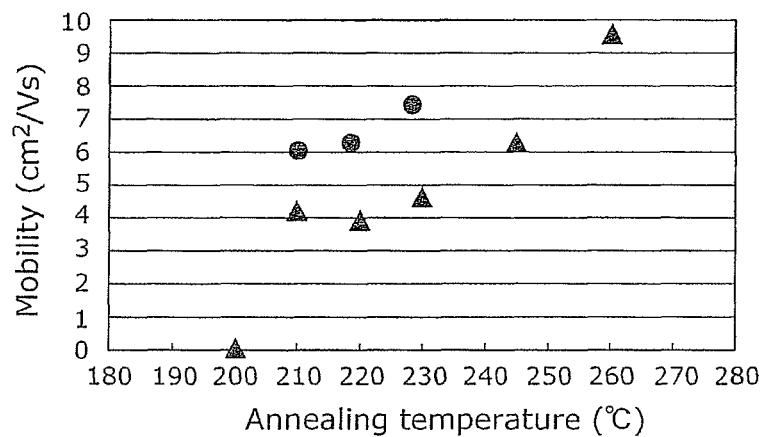
FIG. 6A is a graph showing the thermal annealing temperature dependency of the mobility of a thin film transistor device according to the embodiment.

FIG. 6A is a compilation of the results (each indicated by a black triangle "▲") obtained from FIG. 5A to FIG. 5F, and is a graph showing the thermal annealing temperature dependency of mobility. Here, compared to the mobility corresponding to FIG. 5A to 5E, the mobility corresponding to FIG. 5F shows an extremely small value, and is thus considered undesirable in terms of characteristics.

Figure 6B:
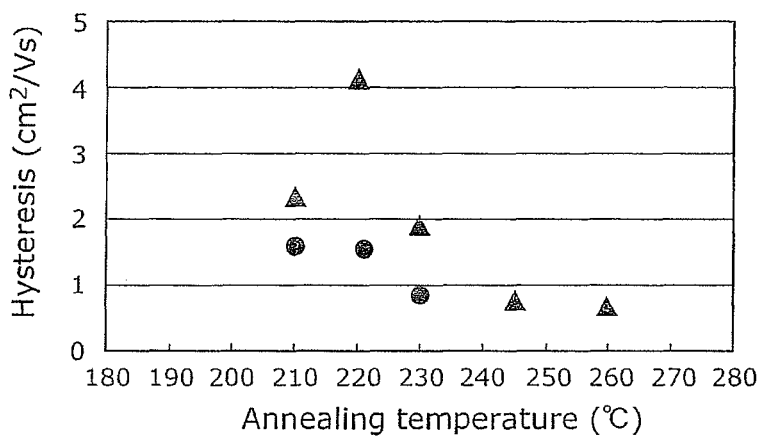
FIG. 6B is a graph showing the thermal annealing temperature dependency of the hysteresis of the thin film transistor device according to the embodiment.

Similarly, FIG. 6B is a compilation of the results (each indicated by a black triangle "▲") obtained from FIG. 5A to FIG. 5F, and is a graph showing the thermal annealing temperature dependency of hysteresis. It is to be noted that, in FIG. 5F, hysteresis is 21V and thus, being located outside the graph of FIG. 6B, is not illustrated.

Figure 6C:
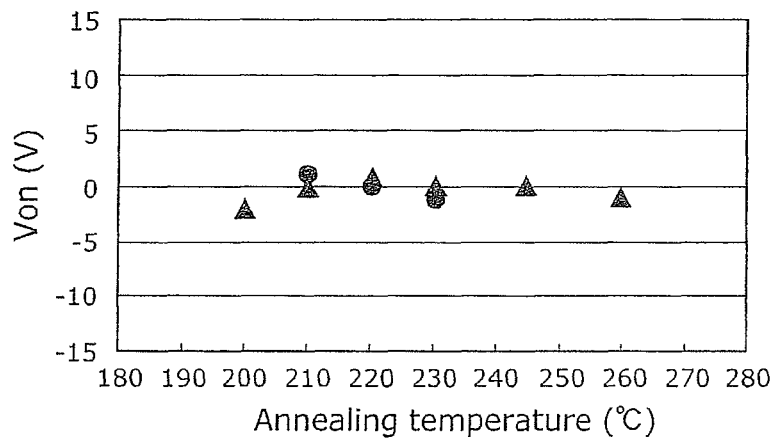
FIG. 6C is a graph showing the thermal annealing temperature dependency of the turn-on voltage of the thin film transistor device according to the embodiment.

Furthermore, FIG. 6C is a compilation of the results (each indicated by a black triangle "▲") obtained from FIG. 5A to FIG. 5F, and is a graph showing the thermal annealing temperature dependency of the turn-on voltage Von. Here, although black circles "●" are illustrated together with the black triangles "▲" in FIG. 6A to FIG. 6C, the black circles "●" indicate data based on FIGS. 14A to 14C and shall be described later.

It can be seen from FIG. 4A and FIG. 4B, FIG. 5A to FIG. 5F, and FIG. 6A to FIG. 6C that, with regard to thermal annealing, a thin film transistor device having high on current and remarkable on-off characteristics is realized at a temperature range of 210° C. to 275° C., inclusive.

Figure 7A:
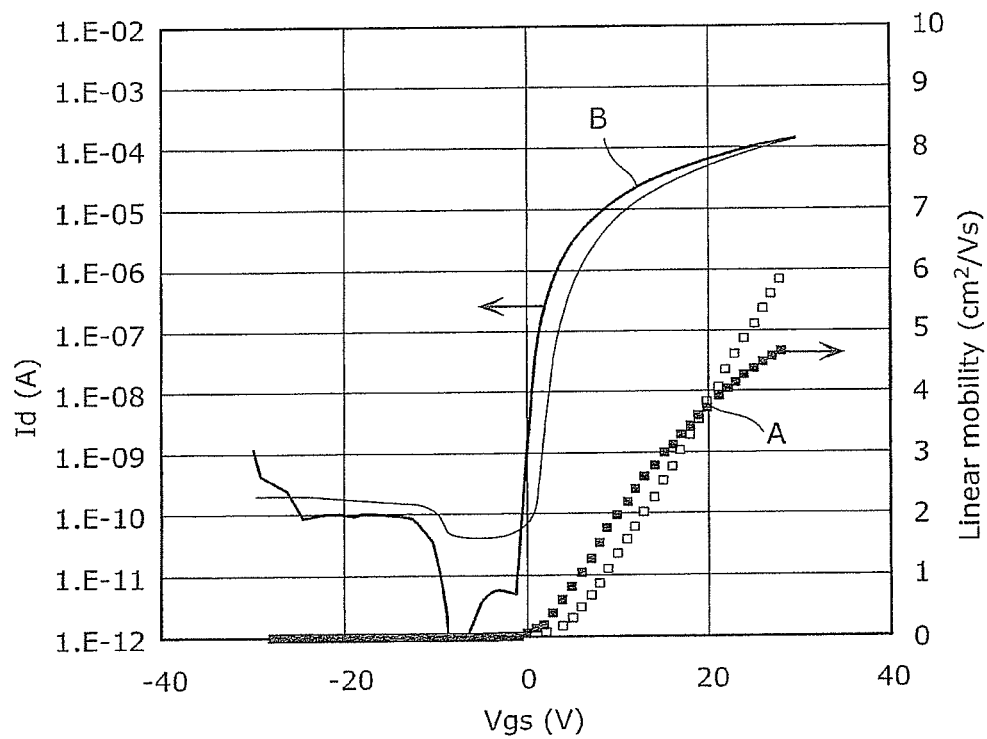
FIG. 7A is a graph showing the gate voltage dependency of the mobility and drain current of a thin film transistor device according to the embodiment.
Figure 8:
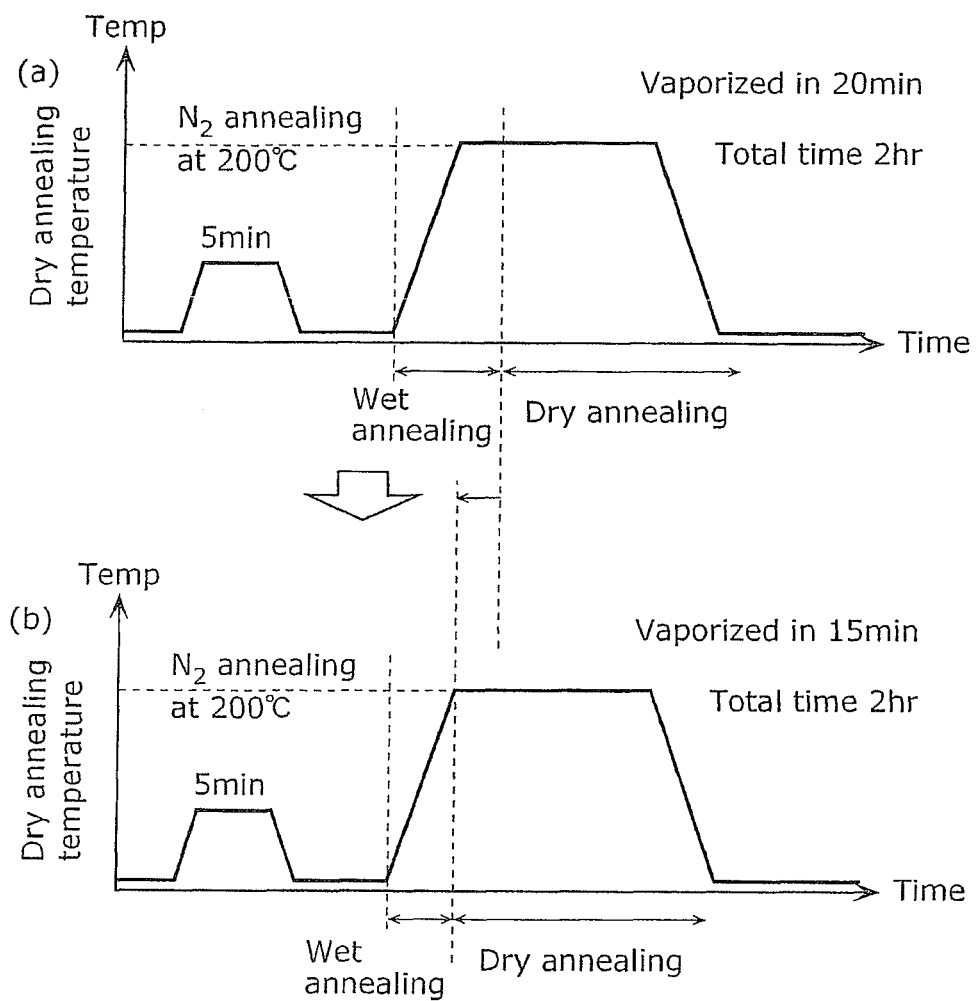
FIG. 8 is a graph showing the time change for thermal annealing temperature in a sol-gel reaction according to the embodiment.
Figure 9A:
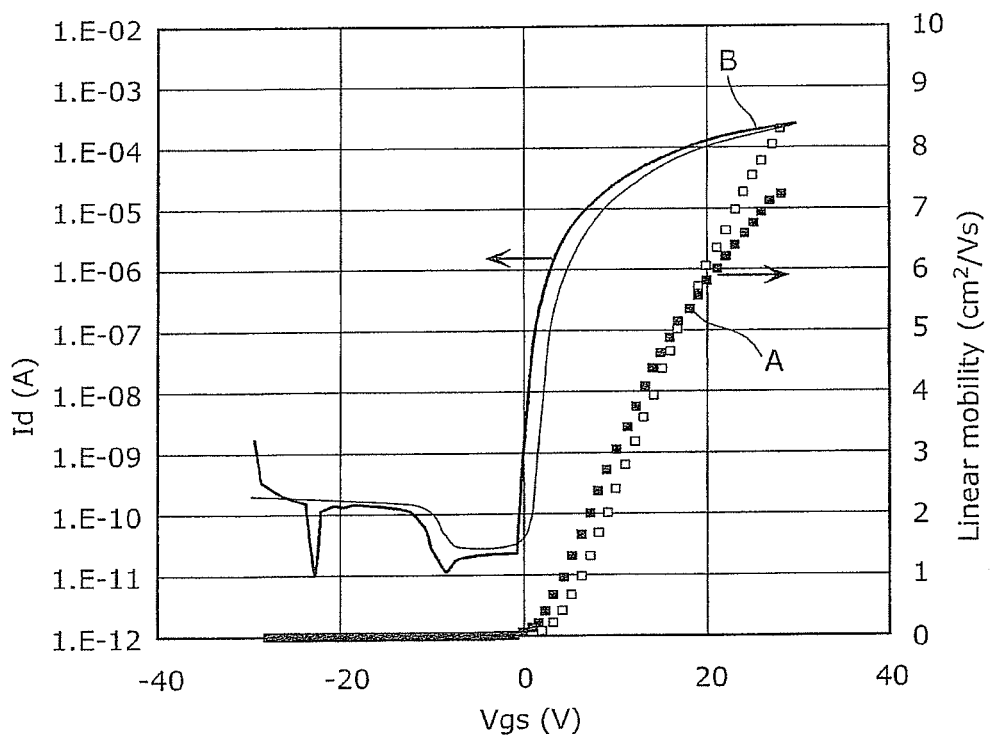
FIG. 9A is a graph showing the gate voltage dependency of the mobility and drain current of a thin film transistor device according to the embodiment.
Figure 9B:
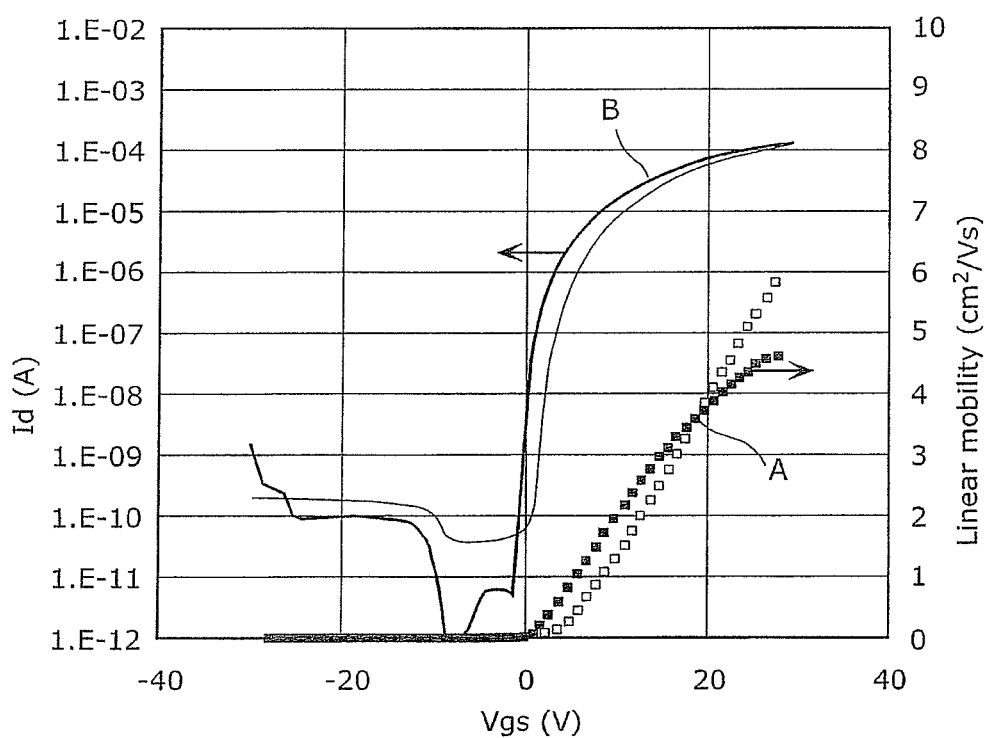
FIG. 9B is a graph showing the gate voltage dependency of the mobility and drain current of a thin film transistor device according to the embodiment.
Figure 9C:
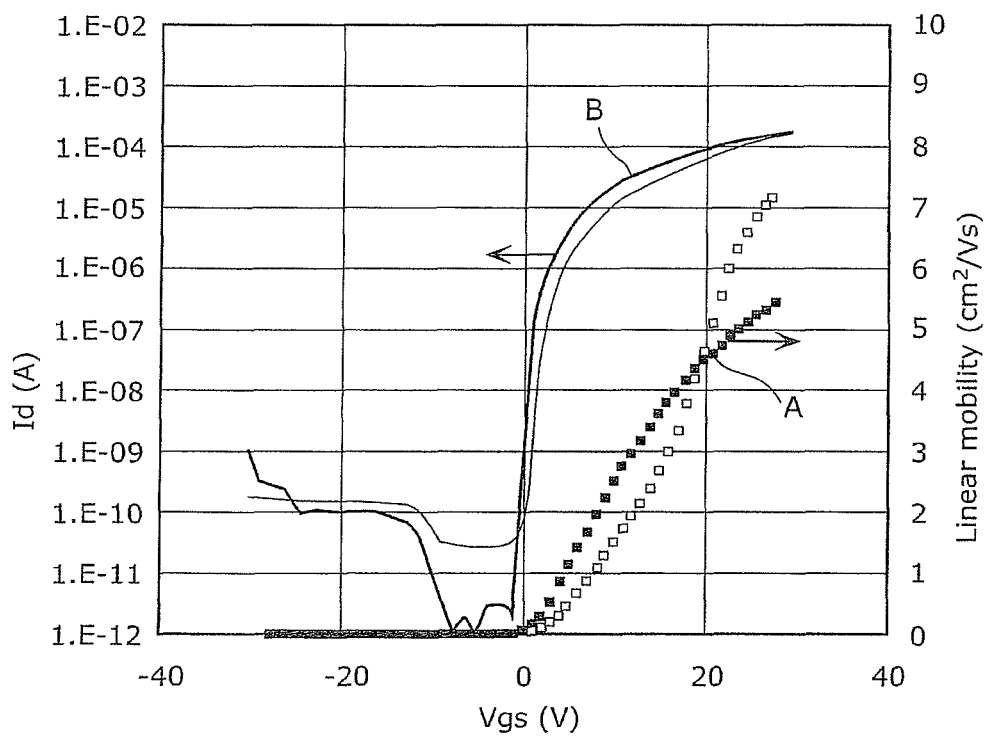
FIG. 9C is a graph showing the gate voltage dependency of the mobility and drain current of a thin film transistor device according to the embodiment.
Figure 9D:
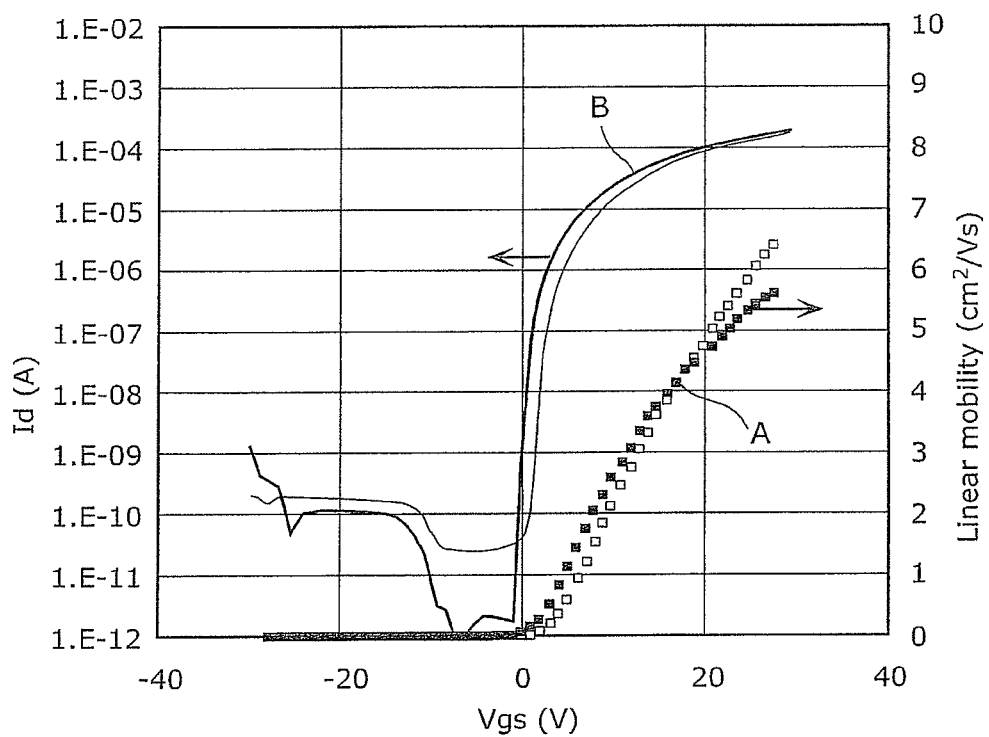
FIG. 9D is a graph showing the gate voltage dependency of the mobility and drain current of a thin film transistor device according to the embodiment.
Figure 9E:
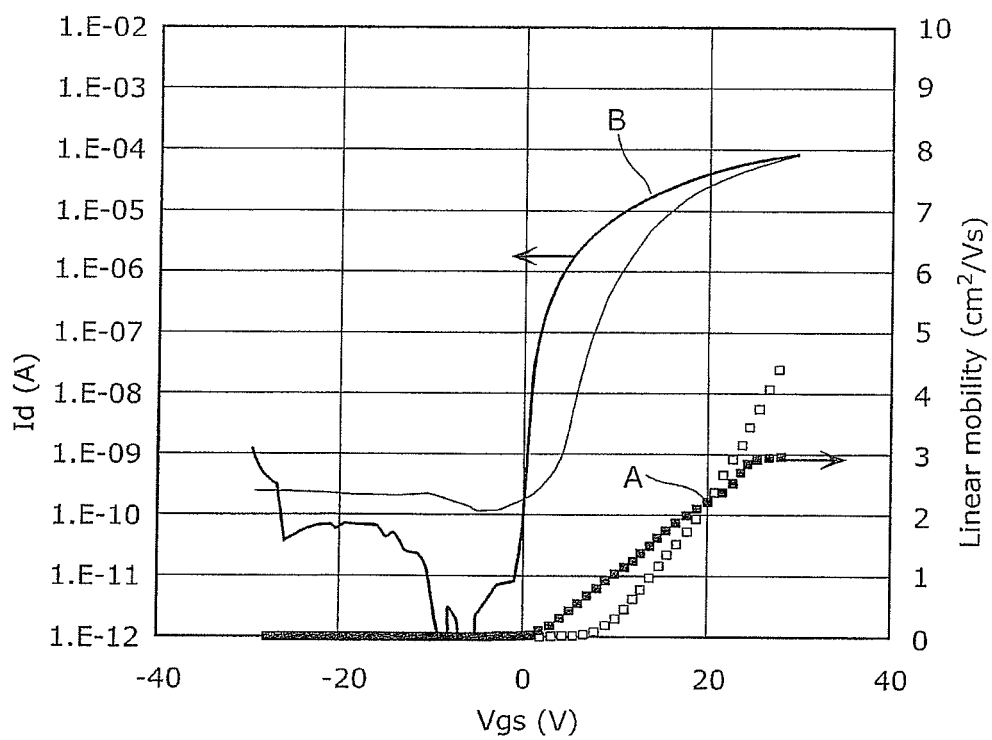
FIG. 9E is a graph showing the gate voltage dependency of the mobility and drain current of a thin film transistor device according to the embodiment.
Figure 9F:
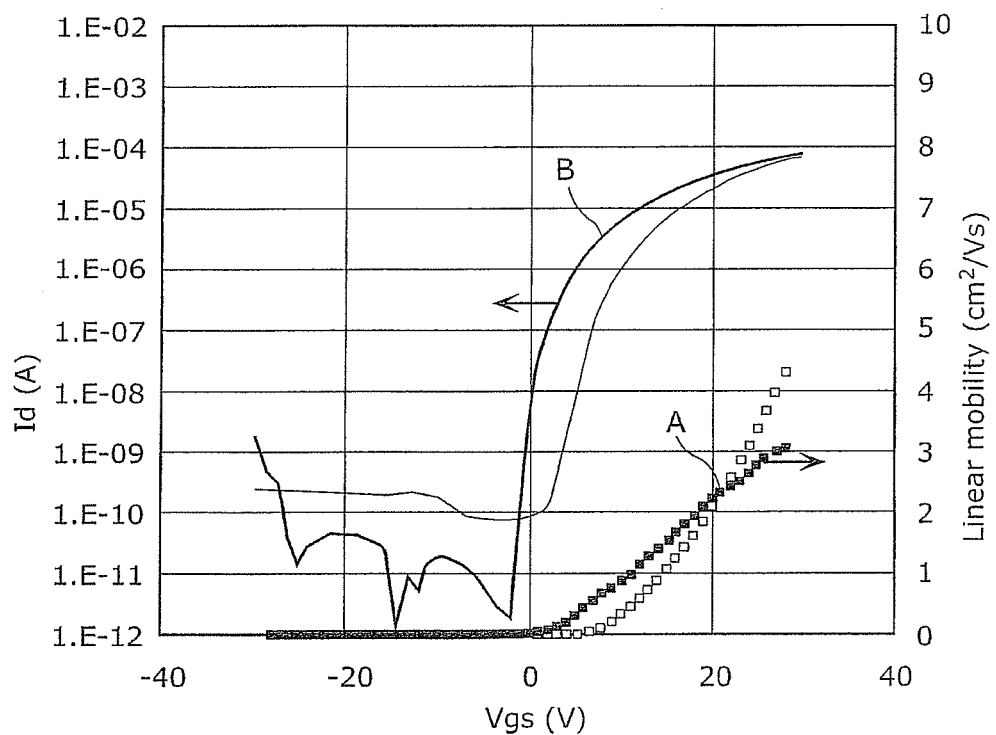
FIG. 9F is a graph showing the gate voltage dependency of the mobility and drain current of a thin film transistor device according to the embodiment.

FIG. 7A is a graph showing the gate voltage dependency of the mobility and drain current of a thin film transistor device when dry annealing is performed for 100 min at a temperature of 230° C. after wet annealing is performed for 20 min. Specifically, FIG. 7A is a graph showing the gate voltage dependency of the mobility and drain current of a thin film transistor device when thermal annealing is performed under the conditions in (a) in FIG. 8, with the dry annealing temperature at 230° C.

Figure 7B:
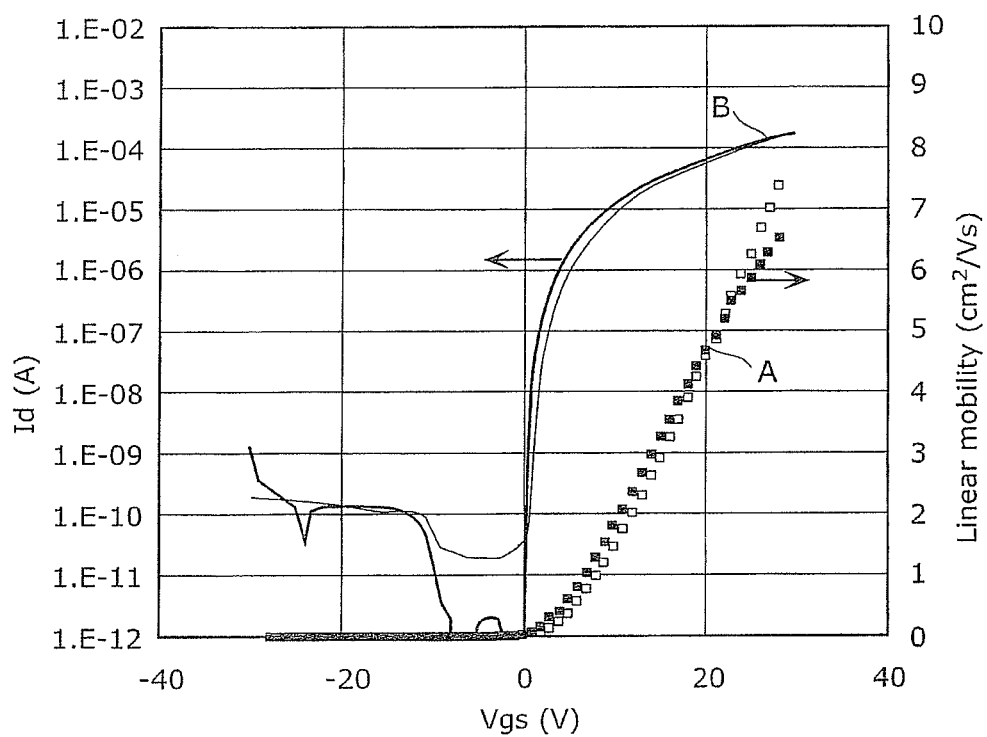
FIG. 7B is a graph showing the gate voltage dependency of the mobility and drain current of a thin film transistor device according to the embodiment.

FIG. 7B is a graph showing the gate voltage dependency of the mobility and drain current of a thin film transistor device when dry annealing is performed for 105 min at a temperature of 230° C. after wet annealing is performed for 15 min. Specifically, FIG. 7B is a graph showing the gate voltage dependency of the mobility and drain current of a thin film transistor device when thermal annealing is performed under the conditions in (b) in FIG. 8, with the dry annealing temperature at 230° C.

Figure 7C:
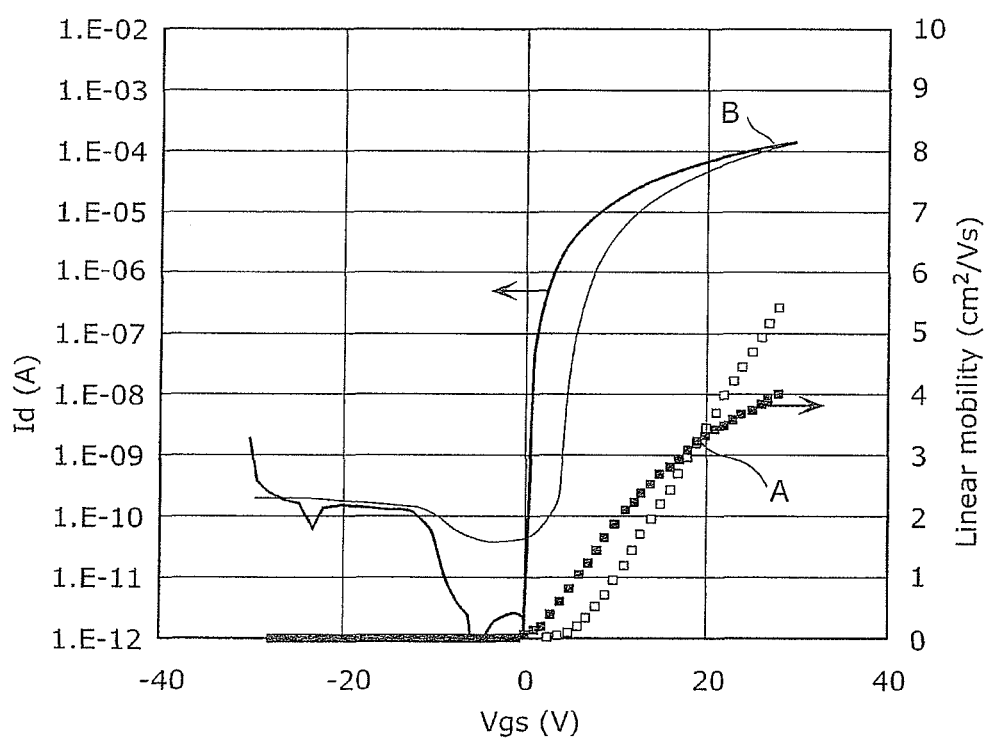
FIG. 7C is a graph showing the gate voltage dependency of the mobility and drain current of a thin film transistor device according to the embodiment.

FIG. 7C is a graph showing the gate voltage dependency of the mobility and drain current of a thin film transistor device when dry annealing is performed for 99 min at a temperature of 220° C. after wet annealing is performed for 21 min. Specifically, FIG. 7C is a graph showing the gate voltage dependency of the mobility and drain current of a thin film transistor device when thermal annealing is performed under the conditions in (a) in FIG. 8, with the dry annealing temperature at 220° C.

Figure 7D:
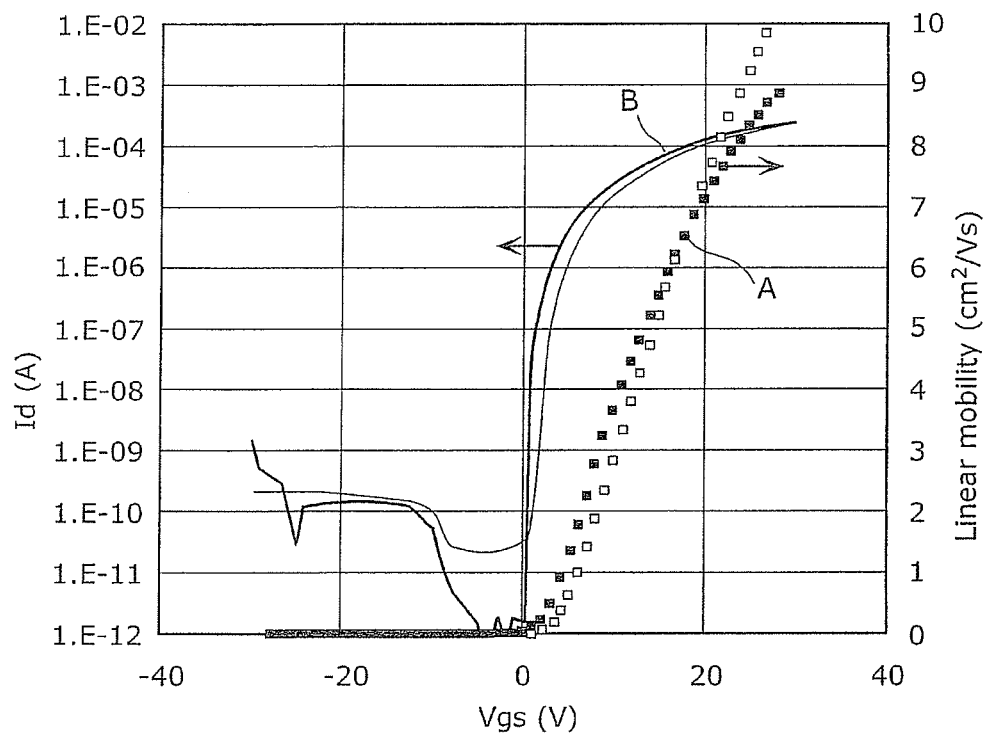
FIG. 7D is a graph showing the gate voltage dependency of the mobility and drain current of a thin film transistor device according to the embodiment.

FIG. 7D is a graph showing the gate voltage dependency of the mobility and drain current of a thin film transistor device when dry annealing is performed for 105 min at a temperature of 220° C. after wet annealing is performed for 15 min. Specifically, FIG. 7D is a graph showing the gate voltage dependency of the mobility and drain current of a thin film transistor device when thermal annealing is performed under the conditions in (b) in FIG. 8, with the dry annealing temperature at 220° C. In FIG. 7A to FIG. 7D, the gate voltage dependency of mobility (A in FIG. 7A to FIG. 7D) is shown using black and white squares ("■", "□"), and the gate voltage dependency of the drain current (B in FIG. 7A to FIG. 7D) is shown using a solid line.

It is to be noted that, as a result of extraction based on the above-described definition of the respective characteristics, in the thin film transistor device in FIG. 7A, the turn-on voltage Von is 0V, hysteresis is 1.9V, and maximum mobility is 4.6 cm$^2$/Vs. In the thin film transistor device in FIG. 7B, the turn-on voltage Von is 1V, hysteresis is 0.9V, and maximum mobility is 6.5 cm$^2$/Vs. In the thin film transistor device in FIG. 7C, the turn-on voltage Von is 1V, hysteresis is 4.1V, and maximum mobility is 3.9 cm$^2$/Vs. In the thin film transistor device in FIG. 7D, the turn-on voltage Von is 0V, hysteresis is 1.5V, and maximum mobility is 9.0 cm$^2$/Vs.

It can be seen from FIG. 7A to FIG. 7D that, from the viewpoint of turn-on voltage, hysteresis, and mobility, it is preferable that the wet annealing time be 15 min.

Figure 10:
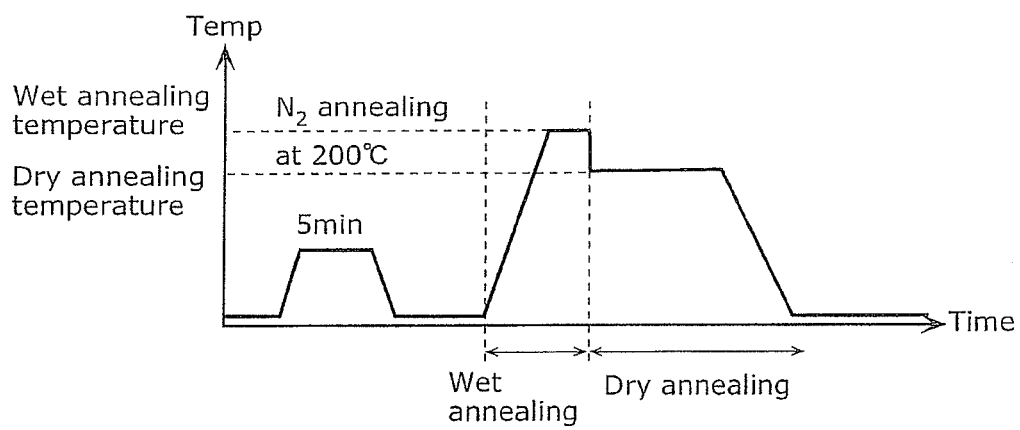
FIG. 10 is a graph showing the time change for thermal annealing temperature in a sol-gel reaction according to the embodiment.

FIG. 9A to FIG. 9F are graphs respectively showing the gate voltage dependency of the mobility and drain current of a thin film transistor device when, in performing thermal annealing for 2 hours, wet annealing is performed at 230° C. and dry annealing is performed at 210° C., 230° C., 245° C., 260° C., 190° C., and 200° C. Specifically, FIG. 9A to FIG. 9F are graphs respectively showing the gate voltage dependency of the mobility and drain current of a thin film transistor device when thermal annealing is performed under the conditions in FIG. 10, with the wet annealing temperature at 230° C. and the dry annealing temperature at 210° C., 230° C., 245° C., 260° C., 190° C., and 200° C. It is to be noted that, in FIG. 9A to FIG. 9F, the gate voltage dependency of mobility (A in FIG. 9A to FIG. 9F) is shown using black and white squares ("■", "□"), and the gate voltage dependency of the drain current (B in FIG. 9A to FIG. 9F) is shown using a solid line.

Although, from the viewpoint of process simplification, it is preferable that the wet anneal temperature and the dry anneal temperature be the same, it can be seen from FIG. 9A to FIG. 9F that satisfactory turn-on voltage, hysteresis, and mobility can be obtained even when the wet annealing temperature and the dry annealing temperature are not the same. Specifically, as shown in FIG. 9A to FIG. 9F, with the wet annealing temperature at 230° C., more satisfactory characteristics can be obtained when the dry annealing temperature is at 210° C., 230° C., 245° C., or 260° C. than when the dry annealing temperature is at 190° C. or 200° C.

Figure 12:
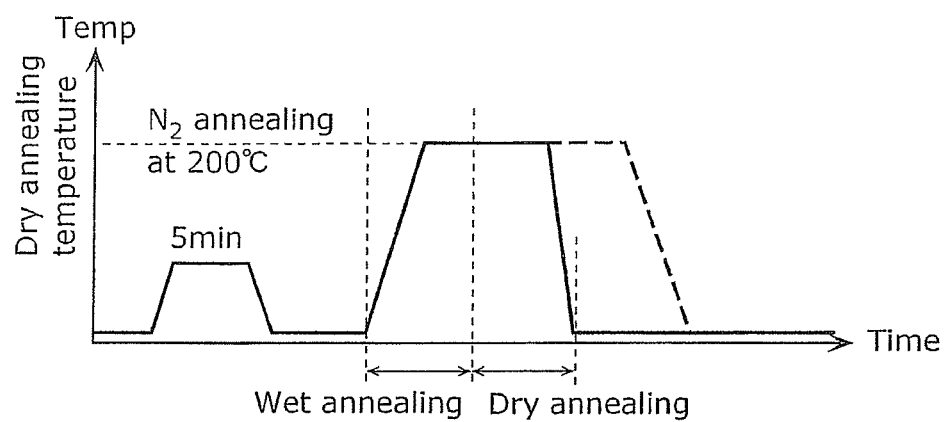
FIG. 12 is a graph showing the time change for thermal annealing temperature in a sol-gel reaction according to the embodiment.

FIG. 11A to FIG. 11E are graphs respectively showing the gate voltage dependency of the mobility and drain current of a thin film transistor device when, in performing thermal annealing at 230° C., dry annealing is performed for 0 min, 5 min, 15 min, 30 min, and 60 min, after wet annealing is performed for 20 minutes. Specifically, FIG. 11A to FIG. 11E are graphs respectively showing the gate voltage dependency of the mobility and drain current of a thin film transistor device when thermal annealing is performed under the conditions in FIG. 12, with the dry annealing temperature of 230° C., and dry annealing times of 0 min, 5 min, 15 min, 30 min, and 60 min. It is to be noted that, in FIG. 11A to FIG. 11E, the gate voltage dependency of mobility (A in FIG. 11A to FIG. 11E) is shown using black and white squares ("■", "□"), and the gate voltage dependency of the drain current (B in FIG. 11A to FIG. 11E) is shown using a solid line.

Figure 13A:
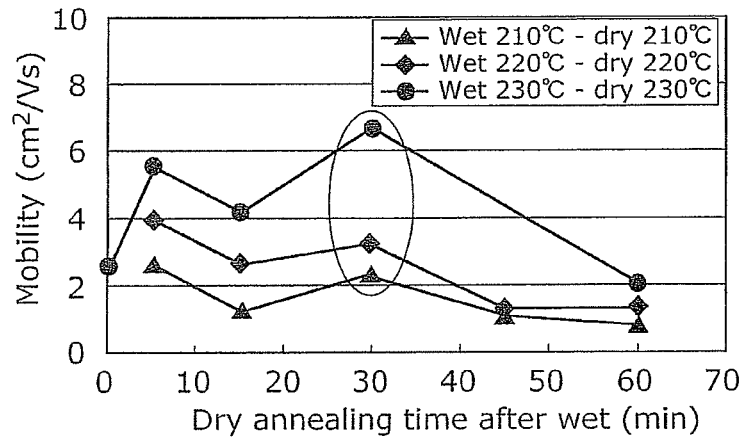
FIG. 13A is a graph showing the dry annealing time dependency of the mobility of a thin film transistor device according to the embodiment.
Figure 13B:
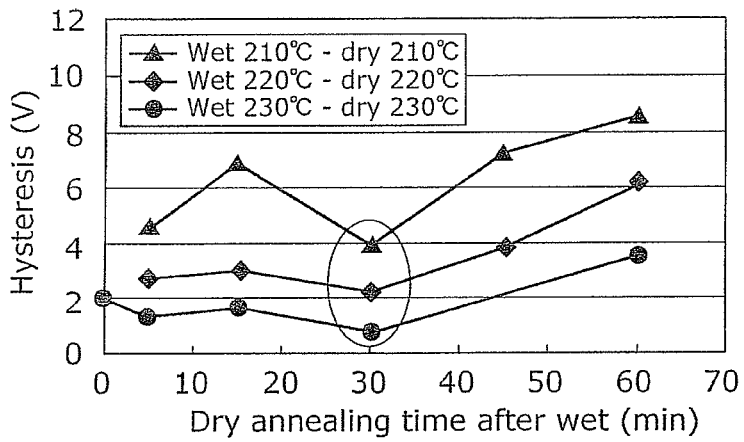
FIG. 13B is a graph showing the dry annealing time dependency of the hysteresis of the thin film transistor device according to the embodiment.
Figure 13C:
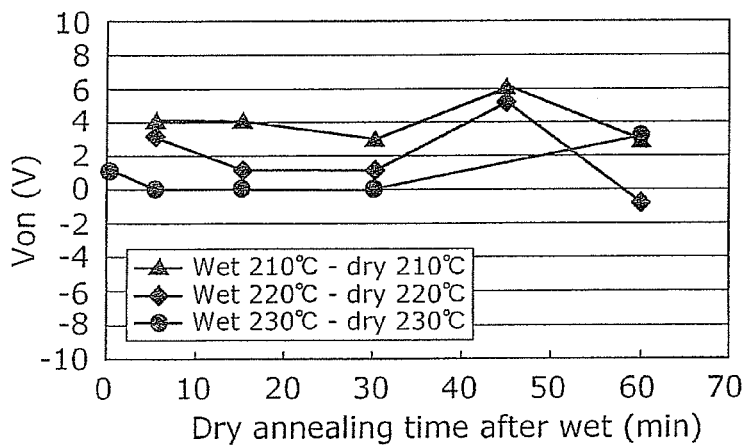
FIG. 13C is a graph showing the dry annealing time dependency of the turn-on voltage of the thin film transistor device according to the embodiment.

FIG. 13A is a graph showing the dependency of mobility on the dry annealing time for the cases where the dry annealing temperature is at 210° C., 220° C., and 230° C. Similarly, FIG. 13B is a graph showing the dependency of hysteresis on the dry annealing time for the cases where the dry annealing temperature is at 210° C., 220° C., and 230° C. Furthermore, FIG. 13C is a graph showing the dependency of turn-on voltage Von on the dry annealing time for the cases where the dry annealing temperature is at 210° C., 220° C., and 230° C.

It can be seen from FIG. 11A to FIG. 11E and FIG. 13A to FIG. 13C that, in the case where the wet annealing temperature and the dry annealing temperature are the same, it is preferable from the viewpoint of turn-on voltage, hysteresis, and mobility that dry annealing time be 30 min when wet annealing time is 20 min. Furthermore, it can be seen from FIG. 11A that satisfactory turn-on voltage, hysteresis, and mobility can be obtained even when dry annealing is not performed and only wet annealing is performed.

Figure 14A:
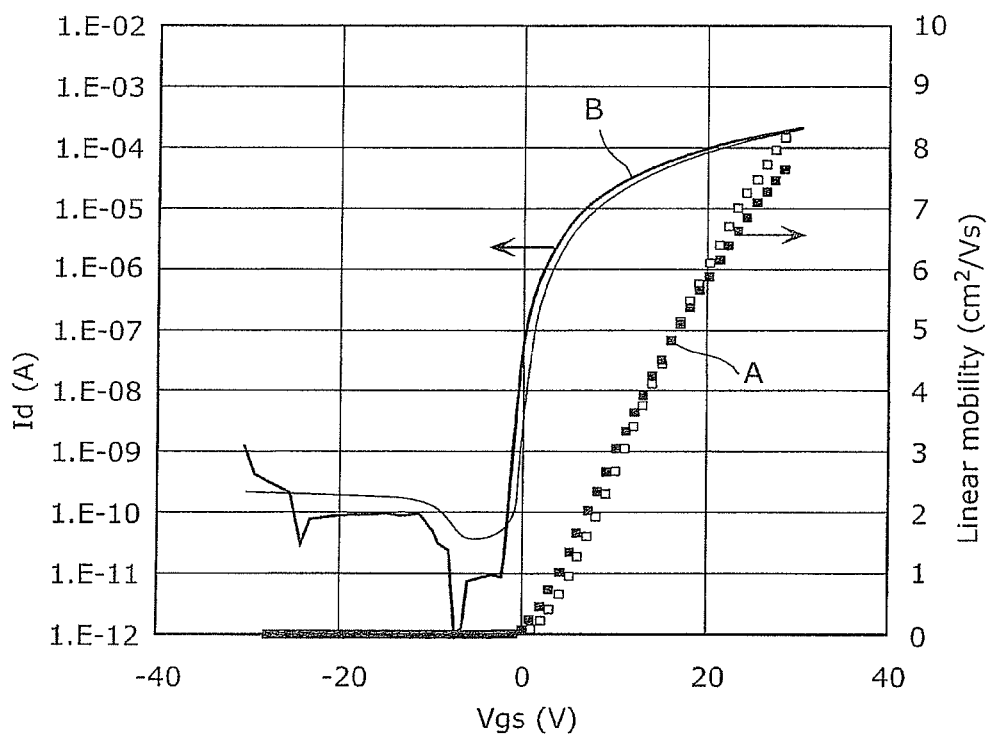
FIG. 14A is a graph showing the gate voltage dependency of the mobility and drain current of a thin film transistor device according to the embodiment.
Figure 14B:
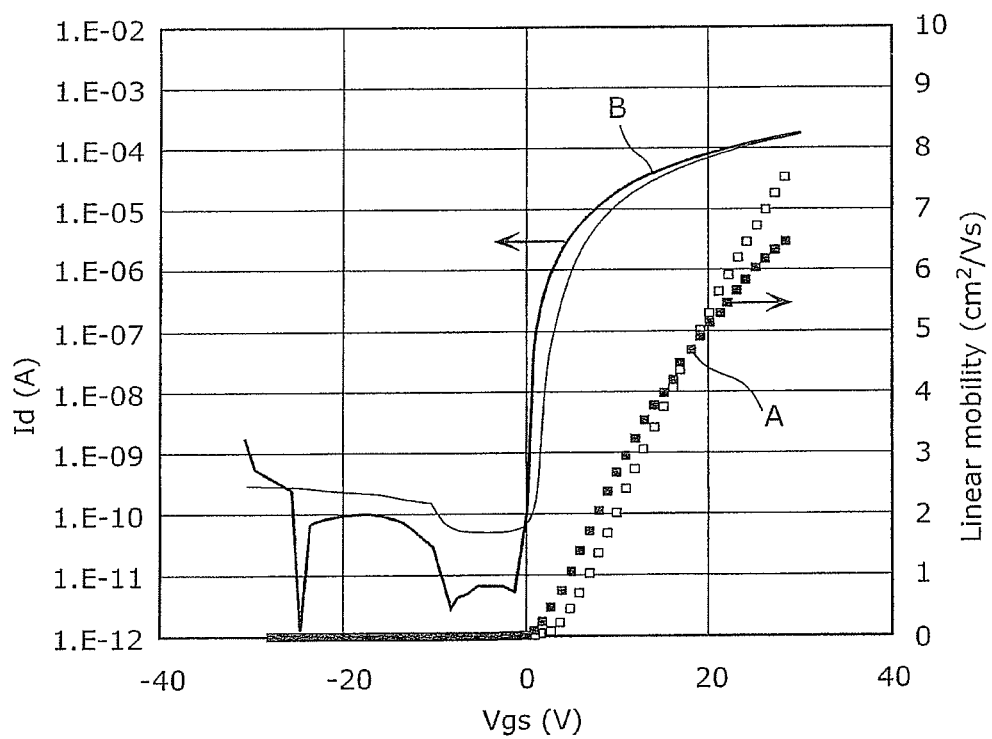
FIG. 14B is a graph showing the gate voltage dependency of the mobility and drain current of a thin film transistor device according to the embodiment.
Figure 14C:
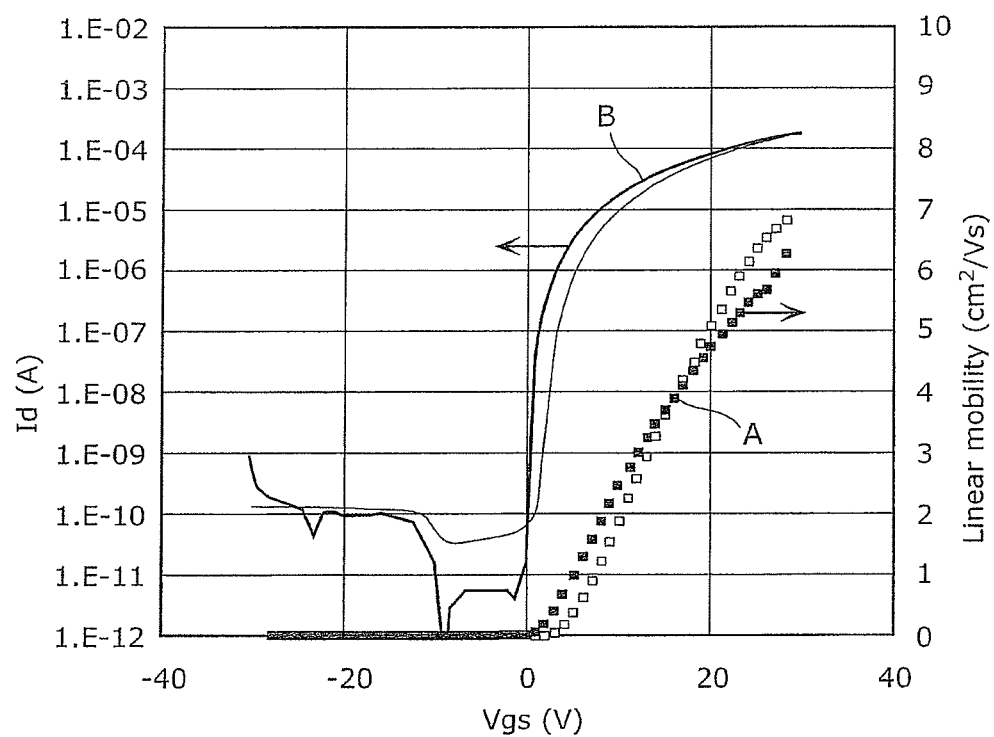
FIG. 14C is a graph showing the gate voltage dependency of the mobility and drain current of a thin film transistor device according to the embodiment.
Figure 15:
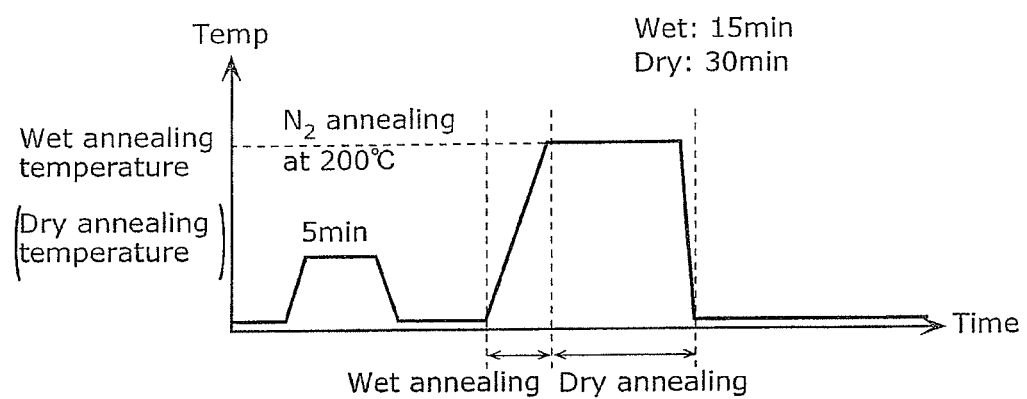
FIG. 15 is a graph showing the time change for thermal annealing temperature in a sol-gel reaction according to the embodiment.

FIG. 14A to FIG. 14C are graphs respectively showing the gate voltage dependency of the mobility and drain current of a thin film transistor device when, in performing wet annealing for 15 min and dry annealing for 30 min, wet annealing temperature is set at 230° C., 220° C., and 210° C. Specifically, FIG. 14A to FIG. 14C are graphs respectively showing the gate voltage dependency of the mobility and drain current of a thin film transistor device when thermal annealing is performed under the conditions in FIG. 15, with the dry annealing temperature and wet annealing temperature at 230° C., 220° C., and 210° C. In FIG. 14A to FIG. 14C, the gate voltage dependency of mobility (A in FIG. 14A to FIG. 14C) is shown using black and white squares ("■", "□"), and the gate voltage dependency of the drain current (B in FIG. 14A to FIG. 14C) is shown using a solid line.

It is to be noted that, as a result of extraction based on the above-described definition of the respective characteristics, in the thin film transistor device in FIG. 14A, the turn-on voltage Von is −1V, hysteresis is 0.9V, and maximum mobility is 7.7 cm$^2$/Vs. In the thin film transistor device in FIG. 14B, the turn-on voltage Von is 0V, hysteresis is 1.6V, and maximum mobility is 6.5 cm$^2$/Vs. In the thin film transistor device in FIG. 14C, the turn-on voltage Von is 1V, hysteresis is 1.7V, and maximum mobility is 6.3 cm$^2$/Vs.

FIG. 6A described above is a compilation of the results (each indicated by a black circle "●") obtained from FIG. 14A to FIG. 14C, and is a graph showing the thermal annealing temperature dependency of mobility. Similarly, FIG. 6B is a compilation of the results (each indicated by a black circle "●") obtained from FIG. 14A to FIG. 14C, and is a graph showing the thermal annealing temperature dependency of hysteresis. Furthermore, FIG. 6C is a compilation of the results (each indicated by a black circle "●") obtained from FIG. 14A to FIG. 14C, and is a graph showing the thermal annealing temperature dependency of the turn-on voltage.

According to FIG. 6A to FIG. 6C, and FIG. 14A to FIG. 14C, it is more preferable from the viewpoint of turn-on voltage, hysteresis, and mobility that, in an implementation in which wet annealing and dry annealing are performed successively, both annealing temperatures be between 210° C. to 260° C., inclusive. In addition, it can be seen that it is more preferable that both annealing temperatures be between 210° C. to 230° C., inclusive, and wet annealing time be 15 min and dry annealing time be 30 min.

As described thus far, according to the method for manufacturing a thin film transistor device in the present embodiment, it is possible to form a thin film of an amorphous metal oxide semiconductor by promoting sol-gel reaction at a low temperature of between 210° C. and 275° C., inclusive.

(Modification 1)

Next, a modification of the method for manufacturing the thin film transistor device in the present embodiment shall be described. In the present modification, description shall focus on the points of difference with the present embodiment. The rest of the constituent elements, and so on, are the same as those in the present embodiment and thus their description shall be omitted.

In the method of manufacturing a thin film transistor device in the present embodiment, the amorphous metal oxide semiconductor layer 13 is formed through the sol-gel method using the metal alkoxide solution 20 which includes an indium alkoxide and a zinc alkoxide. The method of manufacturing a thin film transistor device in the present modification is different from the method of manufacturing a thin film transistor device in the present embodiment in that the amorphous metal oxide semiconductor layer 13 is formed through the sol-gel method using the metal alkoxide solution 20 which includes an indium alkoxide, a zinc alkoxide, and a gallium alkoxide.

Figure 16A:
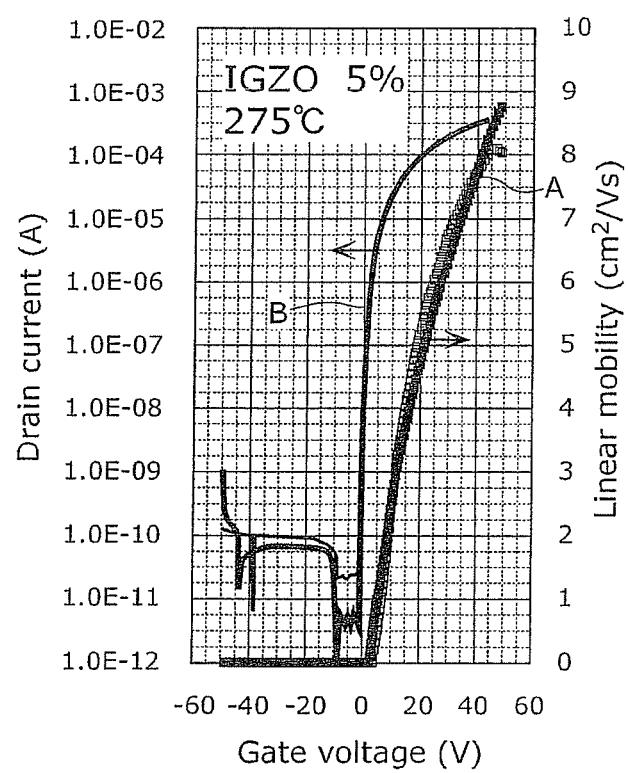
FIG. 16A is a graph showing the gate voltage dependency of the mobility and drain current of a thin film transistor device according to the embodiment.
Figure 16B:
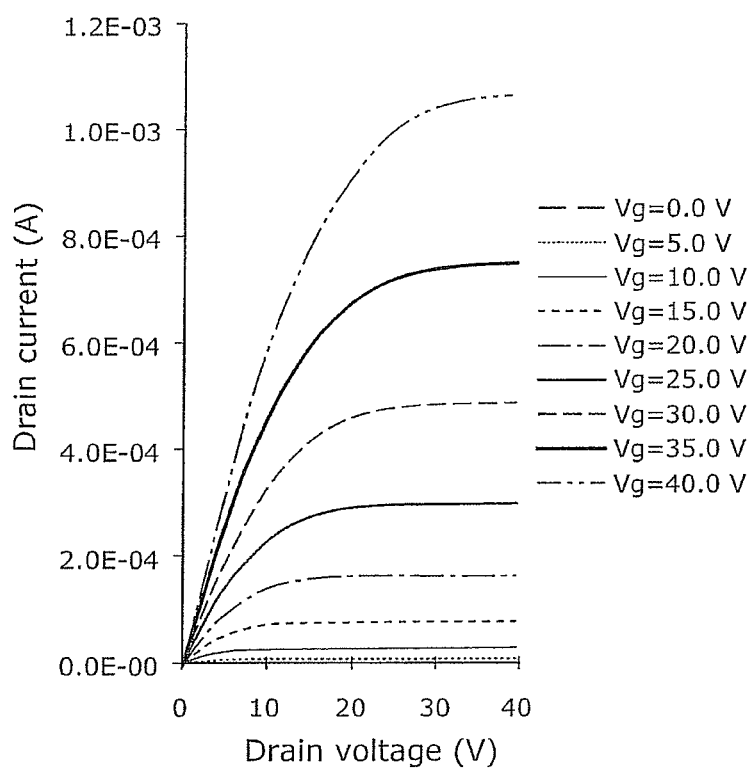
FIG. 16B is a graph showing, for each of different gate voltages, the drain voltage dependency of the drain current of the thin film transistor device.

FIG. 16A and FIG. 16B are graphs showing results of the evaluation of the characteristics of the thin film transistor device according to the present modification.

FIG. 16A is a graph showing the gate voltage dependency of the mobility and drain current of the thin film transistor device when the thermal annealing temperature is set to 275° C. FIG. 16B is a graph showing, for each of different gate voltages, the drain voltage dependency of the drain current of the thin film transistor device.

It can be seen from FIG. 16A and FIG. 16B that, in the thin film transistor device according to the present modification, mobility exceeding that in the conventional thin film transistor device using amorphous silicon, that is, a mobility of 1 $cm^2/Vs$ or more, is realized with the low thermal annealing temperature of 275° C. Furthermore, it can be seen that, compared to the thin film transistor device manufactured using the sol-gel method using only the dry annealing process (FIG. 4C to FIG. 4E), satisfactory characteristics in terms of turn-on voltage, hysteresis, and mobility, are realized in the thin film transistor device according to the present modification.

Although the method for manufacturing the amorphous metal oxide semiconductor device according to the present disclosure has been described thus far based on the present embodiment, the present disclosure is not limited to the above-described embodiment. Various modifications that may be conceived by those skilled in the art which do not depart from the essence of the appended Claims are intended to be included within the scope of the present disclosure.

For example, although the first process and the second process are performed successively in the present embodiment, aside from referring to temporal continuity, the term successively may mean continuity in process order such as performing the first process and the second process in this order, and thus such continuity in process order is not to be excluded.

Furthermore, although the metal alkoxide solution includes a gallium alkoxide in the above described modification of the present embodiment, the metal alkoxide solution may include other metal alkoxide precursors instead of the gallium alkoxide, such as group I, II or III metal alkoxide precursor like Strontium or Barium.

Furthermore, in the above-described present embodiment, the pentameric indium alkoxide cluster $[In_5(\mu^5\text{-}O)(\mu^3\text{-}OPr^i)_4(\mu^2\text{-}OPr^i)_4(OPr^i)_5]$, Gallium tris isopropoxide $[Ga(OPr^i)_3]_2$, and zinc bis methoxyethoxide $[Zn(OC_2H_4OCH_3)_2]$, as shown in Table 1, are selected as molecular precursors for indium zinc oxide (InZnO) and indium Gallium zinc oxide (InGaZnO).

TABLE 1

| Material | Structure/type | Exp. onset temperature of decomposition (° C./% residue) | Activation energy for onset of decomposition/Kjmol | Expected oxide & % residue* |
|---|---|---|---|---|
| Indium, oxo cluster $InSO(OPr^i)_4(OPr^i)_4(OPr^i)_5$ (isopropyl groups omitted for clarity) | *(structure diagram)* | 204 (51%) | 119.6 | $In_2O_3$ (51%) |
| Zinc bis methoxyethoxide $Zn(OC_2H_4OCH_3)_2$ | *(structure diagram)* | 341 (38%) | 54.4 | ZnO (38%) |

TABLE 1-continued

| Material | Structure/type | Exp. onset temperature of decomposition (° C./% residue) | Activation energy for onset of decomposition/Kjmol | Expected oxide & % residue* |
|---|---|---|---|---|
| Gallium tris isopropoxide [Ga(OPr$^i$)$_3$]$_2$ (n = 2 or 4 in solution) | (structure shown) | 203 (58%) 528 (47%) 775 (41%) | 172.4 | Ga$_2$O$_3$ (38%) |

*All residue binary oxides match their respective powder diffraction patterns (see SI)

(Modification 2)

In the present modification, description shall focus on the points of difference with the above-described embodiment. The rest of the constituent elements, and so on, are the same as those in the above-described embodiment and thus their description shall be omitted.

The method for manufacturing a thin film transistor device in the present modification is different from the method for manufacturing a thin film transistor device in the above-described embodiment in that the amorphous metal oxide semiconductor layer 13 is formed through the sol-gel method using the metal alkoxide solution 20, that is, the amorphous metal oxide semiconductor layer 13 is formed through the sol-gel method using the metal alkoxide solution 20 which includes, as precursors, the metal alkoxide which comprises at least one type of component selected from an alkyl component, aryl component, perfluoroakyl component, perfluoroaryl component or fluorohydrocarbon component.

FIG. 17A to FIG. 17C and FIG. 18A to FIG. 18B are graphs respectively showing results of the evaluation of the characteristics of the thin film transistor device according to the present modification. Table 2 shows a compound of an alkylzinc alkoxide.

TABLE 2

| Material | Structure/type | Expected oxide |
|---|---|---|
| Etylzinc propoxide Pr$^i$OZnEt Etylzinc butoxide Bu$^t$OZnEt Etylzinc methoxyethoxide MeOC$_2$H$_4$OZnEt | (structure shown) R = Pr$^i$, Bu$^t$, MeOC$_2$H$_4$ | ZnO |

Figure 17A:
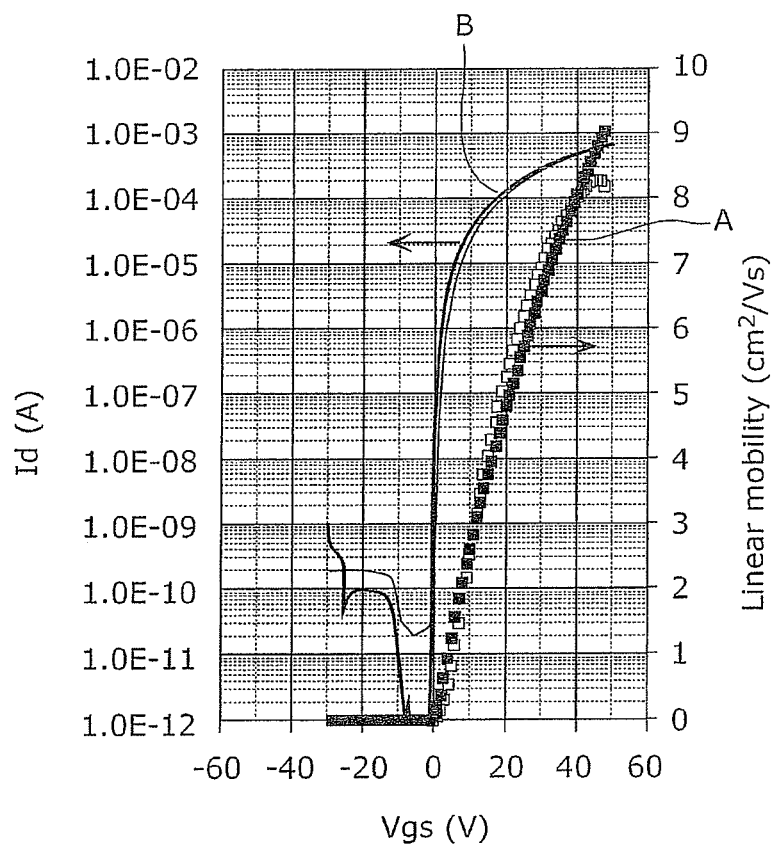
FIG. 17A is a graph showing the gate voltage dependency of mobility and drain current of a thin film transistor device according to a second modification of the exemplary embodiment.
Figure 17B:
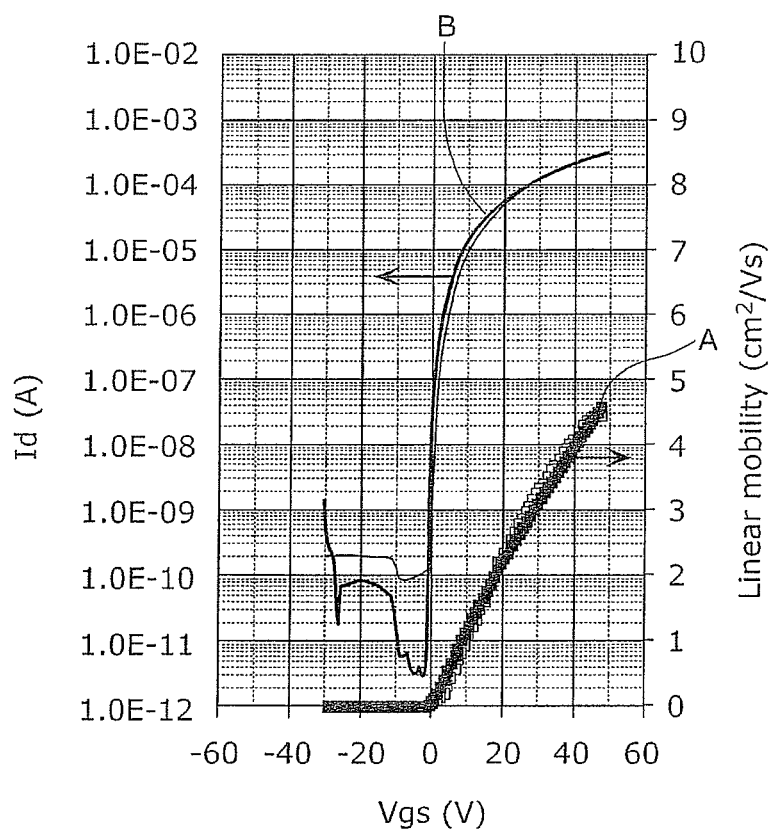
FIG. 17B is a graph showing the gate voltage dependency of mobility and drain current of a thin film transistor device according to the second modification.
Figure 17C:
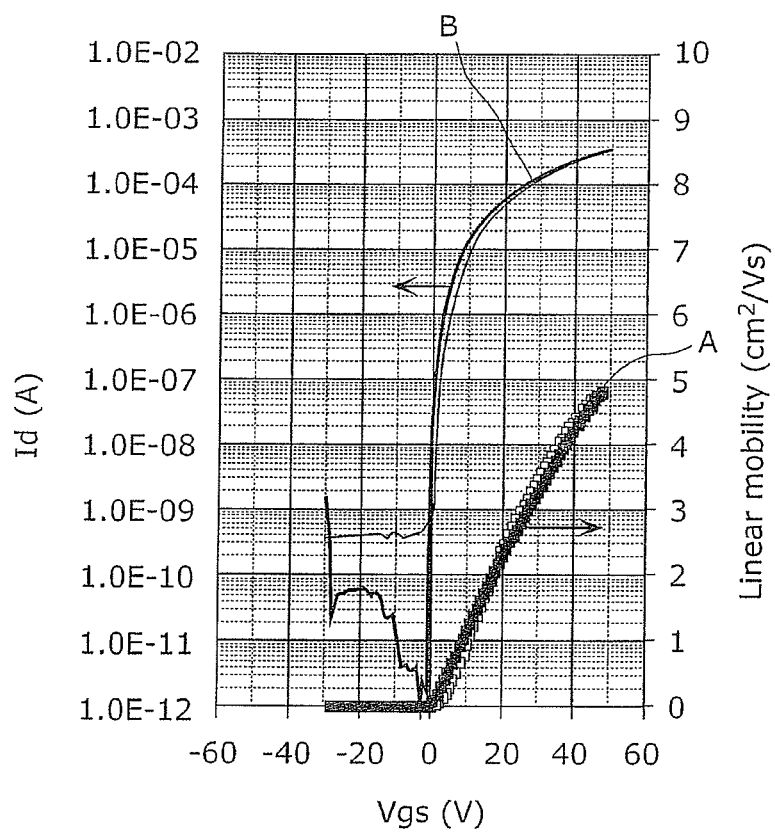
FIG. 17C is a graph showing the gate voltage dependency of mobility and drain current of a thin film transistor device according to the second modification.

FIG. 17A is a graph showing the gate voltage dependency of the mobility and drain current of the thin film transistor device when the thermal annealing is performed for two hours at a temperature of 230° C. using the pentameric indium alkoxide cluster [In$_5$(μ$^5$-O)(μ$^3$-OPr$^i$)$_4$(μ$^2$-OPr$^i$)$_4$(OPr$^i$)$_5$] as the indium alkoxide and the Etylzinc propoxide [Pr$^i$OZnEt] shown in Table 2 as the alkylzinc alkoxide. Similarly, FIG. 17B and FIG. 17C are graphs respectively showing the gate voltage dependency of the mobility and drain current of the thin film transistor device when the thermal annealing is performed for two hours at a temperature of 230° C., with etylzinc butoxide [Bu$^t$OZnEt] being used as the zinc alkoxide in FIG. 17B, and etylzinc methoxyethoxide [MeOC$_2$H$_4$OZnEt] being used as the alkylzinc alkoxide in FIG. 17C. In FIG. 17A to FIG. 17C, the gate voltage dependency of mobility (A in FIG. 17A to FIG. 17C) is shown using black and white squares ("■", "□"), and the gate voltage dependency of the drain current (B in FIG. 17A to FIG. 17C) is shown using a solid line.

With regard to the thin film transistor device in FIG. 17A to FIG. 17C, the turn-on voltage Von, hysteresis, and maximum mobility are extracted based on the definition of the respective characteristics described in the above-described embodiment. As a result, in the thin film transistor device in FIG. 17A, the turn-on voltage Von is −1V, hysteresis is 0.9V, and maximum mobility is 9.0 cm$^2$/Vs. Furthermore, in the thin film transistor device in FIG. 17B, the turn-on voltage Von is −1V, hysteresis is 1.0V, and maximum mobility is 4.6 cm$^2$/Vs. In addition, in the thin film transistor device in FIG. 17C, the turn-on voltage Von is −1V, hysteresis is 1.1V, and maximum mobility is 4.8 cm$^2$/Vs.

It can be seen from FIGS. 17A to 17C that, in the thin film transistor device according to the present modification, mobility exceeding that in the conventional thin film transistor device using amorphous silicon, that is, a mobility of 1 cm$^2$/Vs or more, is realized with the low thermal annealing temperature of 230° C. Furthermore, it can be seen that, compared to the thin film transistor device manufactured using the sol-gel method using only the dry annealing process (FIG. 4C to FIG. 4E), satisfactory characteristics in terms of turn-on voltage, hysteresis, and mobility, are realized in the thin film transistor device according to the present modification.

Figure 18A:
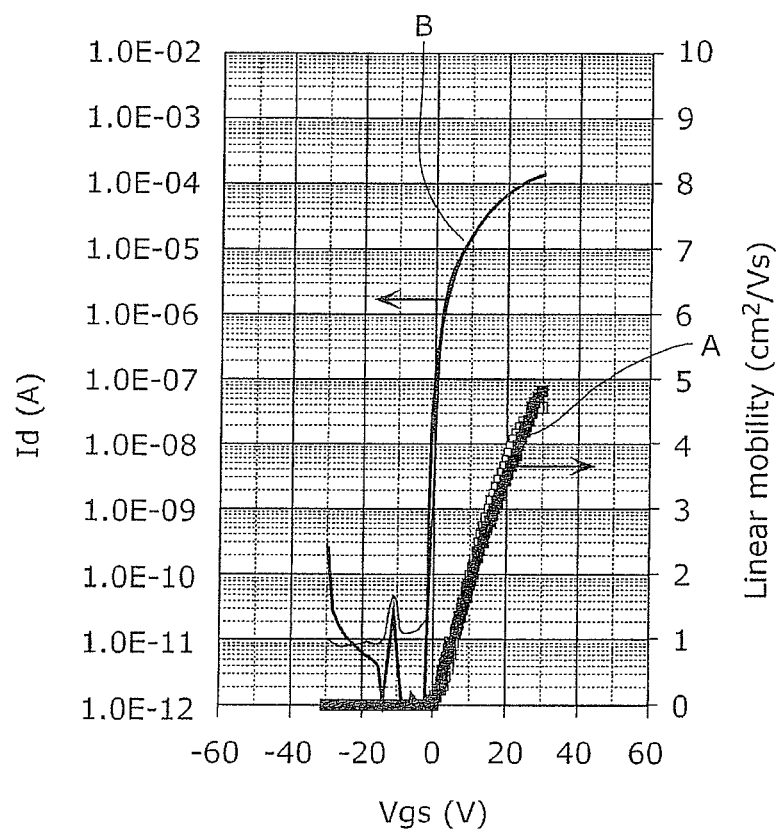
FIG. 18A is a graph showing the gate voltage dependency of mobility and drain current of a thin film transistor device according to the second modification.
Figure 18B:
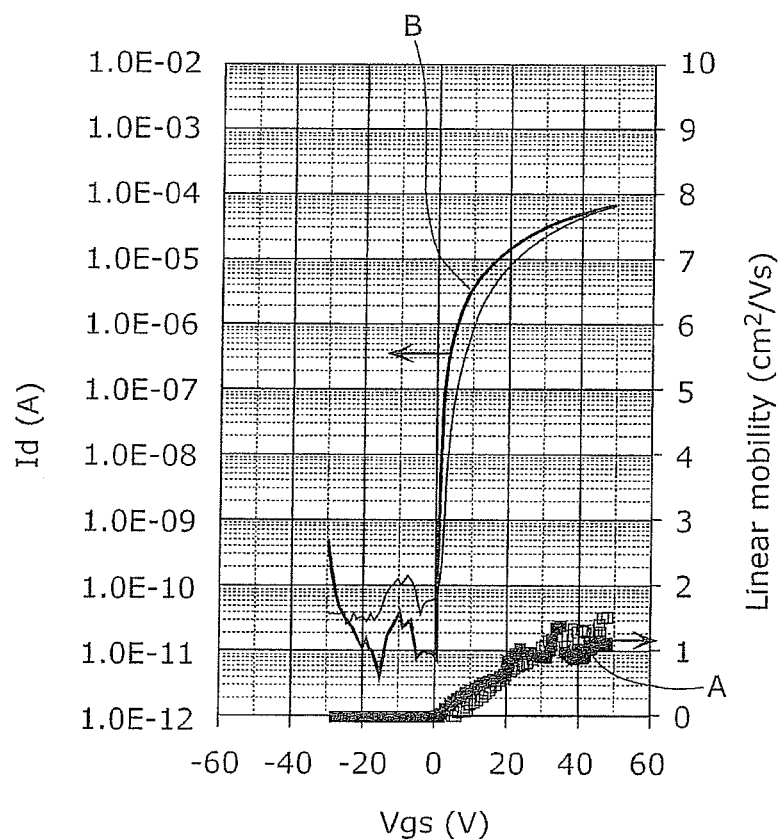
FIG. 18B is a graph showing the gate voltage dependency of mobility and drain current of a thin film transistor device according to the second modification.

FIG. 18A is a graph showing the gate voltage dependency of the mobility and drain current of the thin film transistor device when the thermal annealing is performed for two hours at a temperature of 200° C. using the pentameric indium alkoxide cluster [In$_5$(μ$^5$-O)(μ$^3$-OPr$^i$)$_4$(μ$^2$-OPr$^i$)$_4$(OPr$^i$)$_5$] as the indium alkoxide and Etylzinc propoxide [Pr$^i$OZnEt] as the alkylzinc alkoxide. Similarly, FIG. 18B is a graph showing the gate voltage dependency of the mobility and drain current of a thin film transistor device when thermal annealing is performed for two hours at a temperature of 180° C. using the same metal alkoxide solution. In FIG. 18A and FIG. 18B, the gate voltage dependency of mobility (A in FIG. 18A and FIG. 18B) is shown using black and white squares ("■", "□"), and the gate voltage dependency of the drain current (B in FIG. 18A and FIG. 18B) is shown using a solid line.

With regard to the thin film transistor device in FIG. 18A and FIG. 18B, the turn-on voltage Von, hysteresis, and maximum mobility are extracted based on the definition of the respective characteristics described in the above-described embodiment. As a result, in the thin film transistor device in FIG. 18A, the turn-on voltage Von is −2V, hysteresis is 0.8V, and maximum mobility is 4.8 cm$^2$/Vs. Furthermore, in the thin film transistor device in FIG. 18B, the turn-on voltage Von is 0V, hysteresis is 2.2V, and maximum mobility is 1.4 cm$^2$/Vs.

As seen from FIG. 18A and FIG. 18B, according to the method for manufacturing a thin film transistor device in the present modification, it is possible to form an amorphous metal oxide semiconductor by promoting sol-gel reaction at the low temperature of 200° C. or 180° C.

According to the present modification, predetermined characteristic values can be obtained for the thin film transistor through the thermal annealing at a low temperature region compared to the above-described embodiment. The factors for this can be inferred as follows.

Specifically, it can be inferred that, although a chemical structure represented by Zn(OR)n is used in the above-described embodiment as the zinc alkoxide, by using a chemical structure represented by RZnOR' in the present modification, the decomposition temperature of the precursor can be lowered and, as a result, a satisfactory thin film transistor can be obtained even when the thermal annealing temperature is lowered.

In addition, in the method for manufacturing a thin film transistor in the present modification, TFT characteristics are improved by further increasing the concentration of oxygen contained in the atmosphere in the thermal annealing process performed in a water vapor atmosphere for obtaining the amorphous metal oxide semiconductor layer 13 from the metal alkoxide solution 20. According to the present aspect, the mesh structure of the metal oxide can be formed satisfactorily while supplying sufficient oxygen, and thus it is possible to form an amorphous metal oxide semiconductor having an extremely small amount of oxygen defects. Such a state is realized, for example, by (i) supplying a gas containing water vapor into the container in which the forming of the amorphous metal oxide semiconductor layer 13 is performed so that the humidity in the container is higher than atmospheric humidity, and (ii) at the same time supplying a gas containing a relatively high concentration of oxygen so that the oxygen concentration in the container is higher than the atmospheric oxygen concentration. Although water vapor can be obtained through vaporization of water by heating, here, it is useful to use water containing hydrogen peroxide $H_2O_2$. This is because heating causes hydrogen peroxide to decompose into water and oxygen based on the reaction in expression 4 such that a gas containing water vapor and oxygen is generated, and thus there is the advantage of being able to supply oxygen concurrently with the supplying of water vapor.

$$2H_2O_2 \rightarrow 2H_2O + O_2 \quad \text{(Expression 4)}$$

Figure 19:
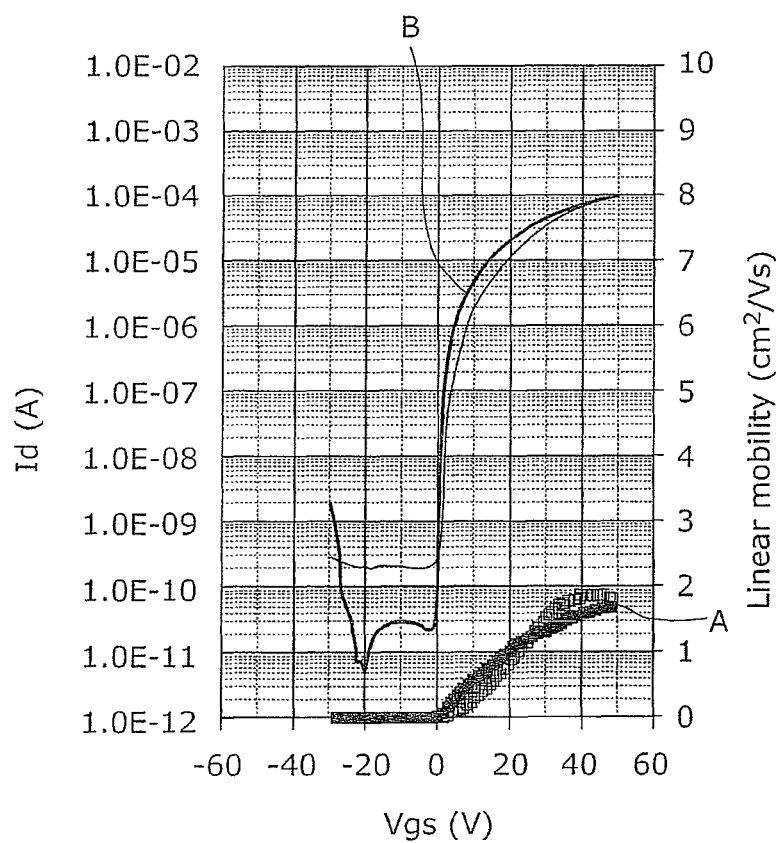
FIG. 19 is a graph showing the gate voltage dependency of mobility and drain current of a thin film transistor device according to the second modification.

FIG. 19 is a graph showing results of the evaluation of the characteristics of the thin film transistor device according to the present modification. FIG. 19 is a graph showing the gate voltage dependency of the mobility and drain current of the thin film transistor device when the thermal annealing is performed for two hours at a temperature of 180° C. in a mixed gas atmosphere containing the water vapor and oxygen generated by heating water containing hydrogen peroxide $H_2O_2$, with the pentameric indium alkoxide cluster $[In_5(\mu^5\text{-}O)(\mu^3\text{-}OPr^j)_4(\mu^2\text{-}OPr^j)_4(OPr^j)_5]$ being used as the indium alkoxide and Etylzinc propoxide [Pr$^j$OZnEt] being used as the alkylzinc alkoxide. In FIG. 19, the gate voltage dependency of mobility (A in FIG. 19) is shown using black and white squares (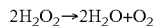), and the gate voltage dependency of the drain current (B in FIG. 19) is shown using a solid line.

With regard to the thin film transistor device in FIG. 19, the turn-on voltage Von, hysteresis, and maximum mobility are extracted based on the definition of the respective characteristics described in the above-described embodiment. As a result, in the thin film transistor device in FIG. 19, the turn-on voltage Von is −1V, hysteresis is 1.4V, and maximum mobility is 1.7 cm$^2$/Vs. As seen from FIG. 19, according to the method for manufacturing a thin film transistor device in the present modification, it is possible to form an amorphous metal oxide semiconductor by promoting sol-gel reaction at the low temperature of 180° C.

Furthermore, in the above-described embodiment, a film is deposited on the substrate 10 from a mixed solution including at least an indium alkoxide and a zinc alkoxide solution as precursors. However, the precursors need not be limited to the indium alkoxide solution and the zinc alkoxide solution as long as a film is deposited on the substrate 10 from a mixed solution of at least two precursors in a solvent with at least one of the precursors being a metal alkoxide.

Furthermore, although an amorphous metal oxide semiconductor is formed in the above-described embodiment, as long as a metal oxide semiconductor is formed, it need not be amorphous.

Furthermore, in the above-described embodiment, a metal oxide semiconductor is formed by curing the film made from the mixed solution deposited on the substrate, by thermal annealing in a water vapor atmosphere. However, a metal oxide semiconductor may be formed by curing the film deposited on the substrate, in the presence of an aqueous catalyst.

At this time, it is preferable that the curing comprises thermal annealing the film deposited on the substrate, at a temperature lower than the thermal decomposition temperature of the metal alkoxide precursor. When the mixed solution includes an indium alkoxide solution and a zinc alkoxide solution as precursors, the indium alkoxide has a decomposition temperature falling within a first temperature range, and the zinc alkoxide has a decomposition temperature falling within a second temperature range which overlaps with the first temperature range. The first temperature range is from 190 to 325 degrees Celsius, inclusive, and the second temperature range is from 190 to 325 degrees Celsius, inclusive.

For example, the thermal annealing of the film deposited on the substrate is performed, at less than 300 degrees Celsius.

Specifically, the thermal-annealing of the film deposited on the substrate is performed, in a water vapor atmosphere, at a temperature range of 180 to 275 degrees Celsius, inclusive.

The herein disclosed subject matter is to be considered descriptive and illustrative only, and the appended Claims are of a scope intended to cover and encompass not only the particular embodiment(s) disclosed, but also equivalent structures, methods, and/or uses.

INDUSTRIAL APPLICABILITY

The one or more exemplary embodiments disclosed herein can be used in an oxide semiconductor, and can be used particularly in a Field Effect Transistor (FET), and so on.

The invention claimed is:
1. A method for manufacturing an amorphous metal oxide semiconductor, the method comprising:
depositing a film on a substrate from a mixed solution of at least two precursors in a solvent, wherein one of the at least two precursors is an indium alkoxide, another of the at least two precursors is a zinc alkoxide, inclusive;

thermal-annealing the film deposited on the substrate, in a water vapor atmosphere; and thermal-annealing the film deposited on the substrate in a non-water vapor atmosphere after the thermal annealing in the water vapor atmosphere, to form, from the mixed solution, an amorphous metal oxide semiconductor.

2. The method according to claim 1, wherein the thermal-annealing in the water vapor atmosphere is performed at a temperature range of 180 to 275 degrees Celsius, inclusive; and the thermal-annealing in the non-water vapor atmosphere is performed at a temperature range of 180 to 275 degrees Celsius, inclusive, after the thermal annealing in the water vapor atmosphere.

3. The method according to claim 1, wherein the thermal-annealing in the non-water vapor atmosphere is performed successively after the thermal-annealing in the water vapor atmosphere is completed.

4. The method according to claim 1, wherein the thermal-annealing in the water vapor atmosphere and the thermal-annealing in the non-water vapor atmosphere are performed at the same temperature.

5. The method according to claim 1, wherein the indium alkoxide having a decomposition temperature falling within a first temperature range, and the zinc alkoxide having a decomposition temperature falling within a second temperature range, the second temperature overlapping with the first temperature range.

6. The method according to claim 5, wherein the first temperature range is from 190 to 325 degrees Celsius, inclusive, and the second temperature range is from 190 to 325 degrees Celsius, inclusive.

7. The method according to claim 1, wherein the indium alkoxide comprises a pentameric indium alkoxide cluster, the zinc alkoxide comprises a zinc bis methoxyethoxide, and the film deposited on the substrate is thermal-annealed, in the water vapor atmosphere, at a temperature range of 210 to 275 degrees Celsius, inclusive.

8. The method according to claim 1, wherein the indium alkoxide comprises a pentameric indium alkoxide cluster, the zinc alkoxide comprises an alkyl component, aryl component, perfluoroakyl component, perfluoroaryl component, or fluorohydrocarbon component.

9. The method according to claim 8, wherein the zinc alkoxide comprises ethylzinc propoxide, ethylzinc butoxide, or ethylzinc methoxyethoxide.

10. The method according to claim 1, wherein the mixed solution further includes other metal alkoxide precursors, included in group I, II, or III metal alkoxide precursor.

11. The method according to claim 1, wherein the other metal alkoxide precursor comprises gallium, barium, or strontium.

12. A method for manufacturing a thin-film transistor, the method comprising forming a channel layer, the channel layer including an amorphous metal oxide semiconductor, wherein the forming of the channel layer includes:

depositing a film on a substrate from a mixed solution of at least two precursors in a solvent, wherein one of the at least two precursors is an indium alkoxide, a second precursor is a zinc alkoxide, inclusive thermal-annealing the film deposited on the substrate, in a water vapor atmosphere; and thermal-annealing the film deposited on the substrate in a non-water vapor atmosphere after the thermal annealing in the water vapor atmosphere, to form, from the mixed solution, an amorphous metal oxide semiconductor.

\* \* \* \* \*